United States Patent
Lee et al.

(10) Patent No.: US 12,057,526 B2
(45) Date of Patent: Aug. 6, 2024

(54) DISPLAY DEVICE HAVING A FIRST BANK DEFINING LIGHT EMISSION REGIONS AND METHOD OF MANUFACTURING THE SAME

(71) Applicant: Samsung Display Co., LTD., Yongin-si (KR)

(72) Inventors: Hang Jae Lee, Yongin-si (KR); Yuk Hyun Nam, Yongin-si (KR); Sung Jae Yun, Yongin-si (KR); Geun Tak Kim, Yongin-si (KR); Jae Hoon Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 407 days.

(21) Appl. No.: 17/306,385

(22) Filed: May 3, 2021

(65) Prior Publication Data
US 2022/0109087 A1    Apr. 7, 2022

(30) Foreign Application Priority Data

Oct. 7, 2020    (KR) .......................... 10-2020-0129603

(51) Int. Cl.
| | |
|---|---|
| *H01L 33/42* | (2010.01) |
| *H01L 25/075* | (2006.01) |
| *H01L 27/12* | (2006.01) |
| *H01L 33/44* | (2010.01) |
| *H01L 33/62* | (2010.01) |

(52) U.S. Cl.
CPC .......... *H01L 33/42* (2013.01); *H01L 25/0753* (2013.01); *H01L 27/1214* (2013.01); *H01L 33/44* (2013.01); *H01L 33/62* (2013.01); *H01L 2933/0016* (2013.01);
(Continued)

(58) Field of Classification Search
CPC . H01L 33/42; H01L 25/0753; H01L 27/1214; H01L 33/44; H01L 33/62; H01L 2933/0016; H01L 2933/0025; H01L 2933/0066; H01L 2933/0091;
(Continued)

(56) References Cited

U.S. PATENT DOCUMENTS

| | | |
|---|---|---|
| 8,890,402 B2 | 11/2014 | Mori et al. |
| 10,026,777 B2 | 7/2018 | Kang et al. |

(Continued)

FOREIGN PATENT DOCUMENTS

| | | |
|---|---|---|
| JP | 2010-182449 | 8/2010 |
| KR | 10-2018-0071465 | 6/2018 |

(Continued)

OTHER PUBLICATIONS

Extended European search report for European Patent Application or Patent No. 21199626.9 dated Mar. 10, 2022.

*Primary Examiner* — Khiem D Nguyen
(74) *Attorney, Agent, or Firm* — KILE PARK REED & HOUTTEMAN PLLC

(57) ABSTRACT

A display device includes a plurality of pixels, a first bank defining light emission regions of the plurality of pixels, a first electrode and a second electrode which are spaced apart from each other in each of the light emission regions, and a plurality of light emitting elements disposed between the first electrode and the second electrode. The first bank, the first electrode, and the second electrode include a same material.

24 Claims, 17 Drawing Sheets

(52) U.S. Cl.
CPC ............... *H01L 2933/0025* (2013.01); *H01L 2933/0066* (2013.01); *H01L 2933/0091* (2013.01)

(58) Field of Classification Search
CPC ......... G09G 3/3233; G09G 2300/0452; G09G 2300/0819
See application file for complete search history.

(56) References Cited

U.S. PATENT DOCUMENTS

| | | | | |
|---|---|---|---|---|
| 10,230,066 | B2* | 3/2019 | Paek | ............ H10K 50/81 |
| 10,651,335 | B2* | 5/2020 | Chiu | ............ H01L 33/0025 |
| 2014/0124746 | A1 | 5/2014 | Hwang | |
| 2016/0111405 | A1* | 4/2016 | Bibl | ............ H01L 33/62 |
| | | | | 257/13 |
| 2017/0040393 | A1* | 2/2017 | Onimaru | ............ H10K 50/11 |
| 2019/0148611 | A1* | 5/2019 | He | ............ H01L 24/29 |
| | | | | 257/72 |
| 2019/0348573 | A1* | 11/2019 | Raymond | ............ H01L 25/0753 |
| 2019/0355939 | A1* | 11/2019 | Fukuda | ............ H05B 33/12 |
| 2020/0006702 | A1* | 1/2020 | Sonoda | ............ H10K 59/88 |
| 2020/0152835 | A1* | 5/2020 | Ko | ............ G09G 3/3233 |
| 2021/0083017 | A1* | 3/2021 | Komatsu | ............ H10K 50/165 |
| 2022/0005979 | A1 | 1/2022 | Kang | |
| 2022/0115470 | A1* | 4/2022 | Kim | ............ H01L 27/1214 |

FOREIGN PATENT DOCUMENTS

| | | |
|---|---|---|
| KR | 10-2019-0124359 | 11/2019 |
| KR | 10-2020-0034896 | 4/2020 |
| KR | 10-2020-0042075 | 4/2020 |
| WO | 2020/059990 | 3/2020 |
| WO | 2020/111413 | 6/2020 |

* cited by examiner

DISPLAY DEVICE HAVING A FIRST BANK DEFINING LIGHT EMISSION REGIONS AND METHOD OF MANUFACTURING THE SAME

CROSS-REFERENCE TO RELATED APPLICATION

This application claims priority to and the benefit of Korean Patent Application No. 10-2020-0129603 under 35 U.S.C. § 119, filed in the Korean Intellectual Property Office (KIPO) on Oct. 7, 2020, the entire contents of which are incorporated herein by reference.

BACKGROUND

1. Technical Field

The disclosure relates to a display device and a method of manufacturing the display device.

2. Description of the Related Art

Recently, an interest in information display has been increased, and thus, research and development on display devices are being continued.

SUMMARY

The disclosure provides a display device and a method of manufacturing the display device, which may increase light emission efficiency of a front surface and reduce cost by reducing the number of masks.

Objects of the disclosure are not limited to the object described above, and other technical objects that are not described may be clearly understood to those skilled in the art from the following description.

An embodiment of the disclosure provides a display device, including a plurality of pixels; a first bank defining light emission regions of the plurality of pixels; a first electrode and a second electrode which are spaced apart from each other in each of the light emission regions; and a plurality of light emitting elements disposed between the first electrode and the second electrode, wherein the first bank, the first electrode, and the second electrode may include a same material.

The first bank, the first electrode, and the second electrode may include a conductive polymer.

The conductive polymer may include at least one of polyfluorene, polyphenylene, polypyrene, polyazulene, polynaphthalene, polyacetylene (PAC), poly(p-phenylene vinylene) (PPV), polypyrrole (PPY), polycarbazole, polyindole, polythienylenevinylene, polyaniline (PANI), polythiophene, poly(p-phenylene sulfide) (PPS), poly(3,4-ethylenedioxythiophene) (PEDOT), poly(3,4-ethylenedioxythiophene) polystyrene sulfonate (PEDOT:PSS), doped with polystyrene sulfonate (PSS), poly(3,4-ethylenedioxythiophene)-tetramethacrylate (PEDOT-TMA), and polyfuran.

The first bank, the first electrode, and the second electrode may include a scattering material dispersed in the conductive polymer.

The scattering material may include at least one of barium sulfate ($BaSO_4$), calcium carbonate ($CaCO_3$), titanium oxide ($TiO_x$), aluminum oxide ($AlO_x$), zirconium oxide ($ZrO_x$), and zinc oxide ($ZnO_x$).

The display device may further include a second bank disposed between the first electrode, the second electrode, and a substrate.

The second bank, the first bank, the first electrode, and the second electrode may include a same material.

The second bank may include a conductive polymer.

The display device may further include an insulating layer disposed between the first electrode, the second electrode, and the plurality of light emitting elements.

The insulating layer may include a resin and a scattering material dispersed in the resin.

The scattering material may include at least one of barium sulfate ($BaSO_4$), calcium carbonate ($CaCO_3$), titanium oxide ($TiO_x$), aluminum oxide ($AlO_x$), zirconium oxide ($ZrO_x$), and zinc oxide ($ZnO_x$).

The display device may further include a first contact electrode that electrically connects an end of each of the plurality of light emitting elements to the first electrode, and a second contact electrode that electrically connects another end of each of the plurality of light emitting elements to the second electrode.

Another embodiment of the disclosure provides a method of manufacturing a display device, including providing a first electrode and a second electrode on a substrate; providing a first bank defining light emission regions of a plurality of pixels; and providing a plurality of light emitting elements between the first electrode and the second electrode, wherein the first bank, the first electrode, and the second electrode are simultaneously formed.

The providing of the first bank, the first electrode, and the second electrode may include providing a conductive polymer layer on the substrate; and patterning the conductive polymer layer to simultaneously form the first bank, the first electrode, and the second electrode.

The conductive polymer layer may include at least one of polyfluorene, polyphenylene, polypyrene, polyazulene, polynaphthalene, polyacetylene (PAC), poly(p-phenylene vinylene) (PPV), polypyrrole (PPY), polycarbazole, polyindole, polythienylenevinylene, polyaniline (PANI), polythiophene, poly(p-phenylene sulfide) (PPS), poly(3,4-ethylenedioxythiophene) (PEDOT), poly(3,4-ethylenedioxythiophene) polystyrene sulfonate (PEDOT:PSS), doped with polystyrene sulfonate (PSS), poly(3,4-ethylenedioxythiophene)-tetramethacrylate (PEDOT-TMA), and polyfuran.

The conductive polymer layer may include a scattering material.

The scattering material may include at least one of barium sulfate ($BaSO_4$), calcium carbonate ($CaCO_3$), titanium oxide ($TiO_x$), aluminum oxide ($AlO_x$), zirconium oxide ($ZrO_x$), and zinc oxide ($ZnO_x$).

The method of manufacturing the display device may further include providing a second bank between the first electrode, the second electrode, and the substrate.

The second bank, the first bank, the first electrode, and the second electrode may be formed at a same time.

The method of manufacturing the display device may further include providing a first contact electrode that electrically connects an end of each of the plurality of light emitting elements to the first electrode; and providing a second contact electrode that electrically connects another end of each of the plurality of light emitting elements to the second electrode.

According to an embodiment of the disclosure, a first bank, a first electrode, and a second electrode may be formed by using a conductive polymer material including a scattering material. Accordingly, light emitted from a light emitting element may be guided in a front direction of a display panel, and thus, light emission efficiency of a front surface of a display device may be increased. The first bank, the first electrode, and the second electrode are simultaneously formed, and thus, the number of masks may be reduced, resulting in a reduction in cost and simplification of a manufacturing process.

Advantages according to the embodiments are not limited by the content described above, and more various effects are included in the specification.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
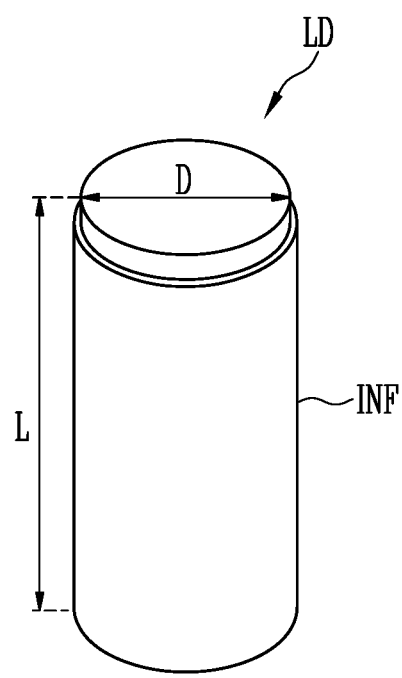
FIGS. 1 and 2 are respectively a perspective view and a cross-sectional view schematically illustrating a light emitting element according to an embodiment.

Advantages and features of the disclosure, and a method of achieving the advantages and features will become apparent with reference to the embodiments to be described below in detail together with the accompanying drawings. However, the disclosure is not limited to the embodiments to be disclosed below and will be implemented in a variety of different forms. The embodiments only make the disclosure more complete and are provided to inform the scope of the disclosure to those skilled in the art to which the disclosure pertains, and the claimed invention is defined by the scope of the claims.

Terms used in the specification are for describing embodiments and are not intended to limit the disclosure. In the specification, a singular form also may include plural meanings unless otherwise specified. Terms "comprises" (or "includes") and/or "comprising" used herein do not exclude presence of one or more other configuration elements, steps, operations, and/or elements, or addition thereof to the elements, steps, operations, and/or elements which are described.

In addition, a term "connection" or "coupling" may mean a physical and/or electrical connection or coupling. In addition, this may mean a direct or indirect connection or coupling and an integral or non-integral connection or coupling.

When referred to as being "on" different elements or elements in different layers, it includes all cases in which another layer or another element is interposed therebetween either directly on or in the middle of another element. The same reference numerals refer to the same elements throughout the specification.

Although first, second, and so on are used to describe various elements, the configuration elements are not limited by the terms. The terms are only used to distinguish one element from another element. Therefore, it goes without saying that the first element to be described below may also be the second element within the technical idea of the disclosure.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described in detail with reference to the accompanying drawings.

Figure 2:
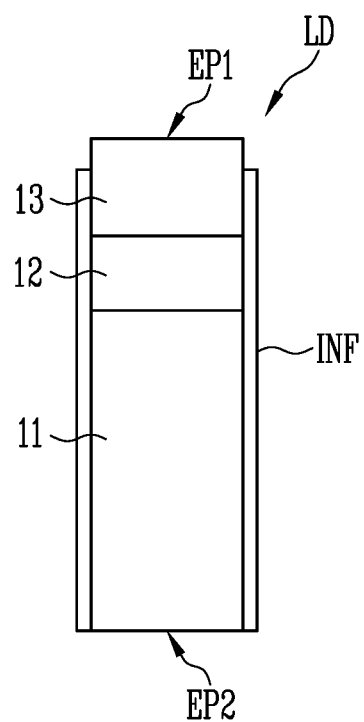

FIGS. 1 and 2 are respectively a perspective view and a cross-sectional view schematically illustrating a light emitting element according to an embodiment. FIGS. 1 and 2 illustrate a columnar light emitting element LD, but a type and/or a shape of the light emitting element LD is not limited thereto.

Referring to FIGS. 1 and 2, the light emitting element LD may include a first semiconductor layer 11, a second semiconductor layer 13, and an active layer 12 interposed between the first semiconductor layer 11 and the second semiconductor layer 13. For example, in case that an extending direction of the light emitting element LD is referred to as a length direction (L), the light emitting element LD may include the first semiconductor layer 11, the active layer 12, and the second semiconductor layer 13 which are sequentially stacked in the length direction (L).

The light emitting element LD may be provided in a columnar shape extending in a direction. The light emitting element LD may have a first end EP1 and a second end EP2. One of the first semiconductor layer 11 and the second semiconductor layer 13 may be arranged at the first end EP1 of the light emitting element LD. The other of the first semiconductor layer 11 and the second semiconductor layer 13 may be arranged at the second end EP2 of the light emitting element LD.

According to an embodiment, the light emitting element LD may be manufactured in a column shape by an etching method or the like. In the specification, the column shape may include a rod-like shape or bar-like shape that is elongated (for example, having an aspect ratio greater than one) in the length direction (L), such as a circular column or polygonal column, and a shape of a cross-section thereof is not limited in particular. For example, a length L of the light emitting element LD may be greater than a diameter D (or a width of a cross section thereof).

The light emitting element LD may have a size in a range of a nanometer scale to a micrometer scale. For example, the light emitting element LD may have a diameter (or width) D and/or a length L in a range of a nanometer scale to a micrometer scale. However, the size of the light emitting element LD is not limited thereto and may be variously changed according to design conditions of various devices using a light emitting device including the light emitting element LD as a light source, for example, a display device.

The first semiconductor layer 11 may be a semiconductor layer of a first conductivity type. For example, the first semiconductor layer 11 may include an n-type semiconductor layer. For example, the first semiconductor layer 11 may include one of InAlGaN, GaN, AlGaN, InGaN, AlN, and InN and may include an n-type semiconductor layer doped with a first conductive dopant such as Si, Ge, and Sn. However, a material forming the first semiconductor layer 11 is not limited thereto, and the first semiconductor layer 11 may be formed of various materials.

The active layer 12 may be disposed on the first semiconductor layer 11 and may be formed in a single quantum well structure or a multi-quantum well structure. A position of the active layer 12 may be variously changed according to the type of the light emitting element LD.

A clad layer (not illustrated) doped with a conductive dopant may be formed on and/or under the active layer 12. For example, the clad layer may be formed of an AlGaN layer or an InAlGaN layer. A material such as AlGaN or InAlGaN may be used to form the active layer 12 according to embodiments, and various other materials may form (or constitute) the active layer 12.

The second semiconductor layer 13 may be disposed on the active layer 12 and may include a semiconductor layer of a type different from that of the first semiconductor layer 11. For example, the second semiconductor layer 13 may include a p-type semiconductor layer. For example, the second semiconductor layer 13 may include at least one of InAlGaN, GaN, AlGaN, InGaN, AlN, and InN and may include a p-type semiconductor layer doped with a second conductive dopant such as Mg. However, a material forming the second semiconductor layer 13 is not limited thereto, and various other materials may form the second semiconductor layer 13.

In case that a voltage greater than or equal to a threshold voltage is applied to both ends of the light emitting element LD, electrons and holes may be coupled to each other in pairs in the active layer 12 to cause the light emitting element LD to emit light. By controlling the light emission of the light emitting element LD by using this principle, the light emitting element LD may be used as a light source for various light emitting devices including pixels of a display device.

The light emitting element LD may further include an insulating film INF provided on a surface thereof. The insulating film INF may be formed on a surface of the light emitting element LD so as to surround at least an outer circumferential surface of the active layer 12 and may further surround a region of each of the first semiconductor layer 11 and the second semiconductor layer 13.

According to an embodiment, the insulating film INF may expose both ends of the light emitting element LD having different polarities. For example, the insulating film INF may expose an end of each of the first semiconductor layer 11 and the second semiconductor layer 13 located at the first end EP1 and the second end EP2 of the light emitting element LD. In another embodiment, the insulating film INF may also expose side portions of the first semiconductor layer 11 and the second semiconductor layer 13 adjacent to the first end EP1 and the second end EP2 of the light emitting element LD having different polarities.

According to an embodiment, the insulating film INF may include at least one of insulating materials such as silicon oxide ($SiO_x$), silicon nitride ($SiN_x$), silicon oxynitride ($SiO_xN_y$), aluminum oxide ($AlO_x$), and titanium oxide ($TiO_x$) and may be formed of a single layer or multiple layers (for example, a double layer including aluminum oxide ($AlO_x$) and silicon oxide ($SiO_x$) but is not limited thereto, and the insulating film INF may be omitted according to embodiments.

In case that the insulating film INF is provided to cover or overlap a surface of the light emitting element LD, particularly an outer circumferential surface of the active layer 12, it may be possible to prevent the active layer 12 from being short-circuited with a first pixel electrode or a second pixel electrode, which will be described below. Accordingly, the electrical stability of the light emitting element LD may be increased.

In case that the insulating film INF is provided on the surface of the light emitting element LD, the life and efficiency thereof may be increased by minimizing (or reducing) surface defects in the light emitting element LD. Even in case that multiple light emitting elements LD are disposed in close contact with each other, the light emitting elements LD may be prevented from being short-circuited undesirably.

In an embodiment, the light emitting element LD may further include additional elements in addition to the first semiconductor layer 11, the active layer 12, the second semiconductor layer 13, and/or the insulating film INF surrounding the layers. For example, the light emitting element LD may further include at least one phosphor layer, at least one active layer, at least one semiconductor layer and/or at least one electrode layer disposed on an end of the first semiconductor layer 11, the active layer 12 and/or the second semiconductor layer 13. For example, a contact electrode layer may be disposed on each of the first end EP1 and the second end EP2 of the light emitting element LD. Although the columnar light emitting element LD is illustrated in FIGS. 1 and 2, the type, structure, and/or shape of the light emitting element LD may be variously changed. For example, the light emitting element LD may be formed in a core-shell structure having a polygonal cone shape.

A light emitting device including the light emitting element LD described above may be used in various types of devices that include a light source, including a display device. For example, light emitting elements LD may be disposed in each pixel of a display panel, and the light emitting elements LD may be used as a light source of each pixel. However, an application field of the light emitting element LD is not limited to the above-described example. For example, the light emitting element LD may be used in other types of devices that require a light source, such as an illumination device.

Figure 3:
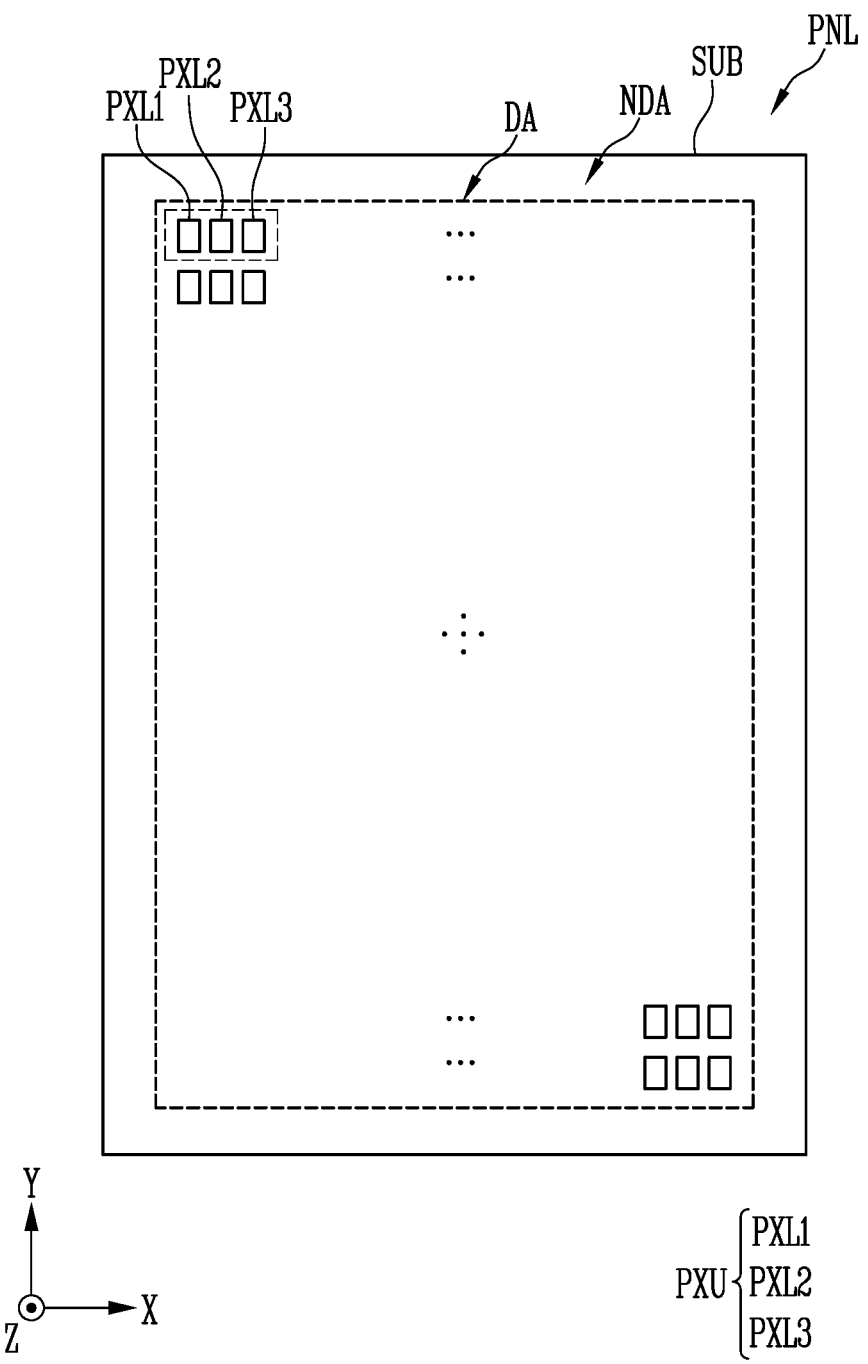
FIG. 3 is a plan view schematically illustrating a display device according to an embodiment.

FIG. 3 is a schematic plan view illustrating a display device according to an embodiment.

FIG. 3 illustrates a display device, particularly, a display panel PNL included in the display device as an example of an electronic device that may use the light emitting element LD described in the embodiments of FIGS. 1 and 2 as a light source.

Each pixel unit PXU of the display panel PNL and each pixel constituting (or forming) the pixel unit PXU may include at least one light emitting element LD. For the sake of convenience, FIG. 3 schematically illustrates a structure of the display panel PNL with the display region DA being in the center. However, in some embodiments, at least one drive circuit part (for example, at least one of a scan driver and a data driver), wires, and/or pads, which are not illustrated, may be further disposed on the display panel PNL.

Referring to FIG. 3, the display panel PNL may include a substrate SUB and the pixel unit PXU disposed on the substrate SUB. The pixel unit PXU may include first pixels PXL1, second pixels PXL2, and/or third pixels PXL3. Hereinafter, at least one of the first pixels PXL1, the second pixels PXL2, and the third pixels PXL3 is referred to as a "pixel PXL," or two or more types of pixels are collectively referred to as "pixels (PXLs)."

The substrate SUB may form a base member of the display panel PNL and may be a rigid substrate, a flexible substrate, or a film. For example, the substrate SUB may be a rigid substrate made of (or include) glass or tempered glass, a flexible substrate made of plastic or metal (or a thin film), or an insulating layer formed as at least one layer. The material and/or physical properties of the substrate SUB are not limited in particular.

In an embodiment, the substrate SUB may be substantially transparent. Here, "substantially transparent" may mean that light may travel through the substrate SUB at equal to or greater than a predetermined transmittance. In another embodiment, the substrate SUB may be translucent or opaque. The substrate SUB may also include a reflective material according to embodiments.

The display panel PNL and the substrate SUB for forming the display panel PNL may include a display region DA for displaying an image and a non-display region NDA adjacent to the display region DA.

The pixels PXL may be disposed in the display region DA. Various wires, pads, and/or, an embedded circuit part electrically connected to the pixels PXL of the display region DA may be disposed in the non-display region NDA. The pixels PXL may be regularly arranged according to a stripe or PenTile® arrangement structure. However, the arrangement structure of the pixels PXL is not limited thereto, and the pixels PXL may be arranged in the display region DA in various structures and/or manners.

According to an embodiment, two or more types of pixels PXL emitting light of different colors may be disposed in the display region DA. For example, first pixels PXL1 emitting light of a first color, second pixels PXL2 emitting light of a second color, and third pixels PXL3 emitting light of a third color may be arranged in the display region DA. At least the first pixel PXL1, the second pixel PXL2, and the third pixel PXL3 arranged to be adjacent to each other may form a pixel unit PXU capable of emitting light of various colors. For example, each of the first to third pixels PXL1, PXL2, and PXL3 may be a sub-pixel that emits light of a predetermined color. According to an embodiment, the first pixel PXL1 may be a red pixel that emits red light, the second pixel PXL2 may be a green pixel that emits green light, and the third pixel PXL3 may be a blue pixel that emits blue light, but the pixels PXL are not limited thereto.

In an embodiment, the first pixel PXL1, the second pixel PXL2, and the third pixel PXL3 may each include, as light sources, a light emitting element of a first color, a light emitting element of a second color, and a light emitting element of a third color, thereby being able to respectively emit light of a first color, a second color, and a third color. In another embodiment, the first pixel PXL1, the second pixel PXL2, and the third pixel PXL3 may include light emitting elements that emit light of the same color, but may also emit light of a first color, a second color, and a third color by including color conversion layers and/or color filters of different colors disposed on respective light emitting elements LD. However, the color, type, and/or number of pixels PXL forming the pixel unit PXU are not limited in particular. For example, the color of light emitted by each pixel PXL may be variously changed.

The pixel PXL may include at least one light source driven by a control signal (for example, a scan signal and a data signal) and/or a power supply (for example, a first power supply and a second power supply). In an embodiment, the light source may include at least one light emitting element LD according to one of the embodiments of FIGS. 1 and 2, for example, microminiature columnar light emitting elements LD having a size in a range of a nanometer scale to a micrometer scale. However, the light source is not limited thereto, and various types of light emitting elements LD may be used as a light source of the pixel PXL.

In an embodiment, each pixel PXL may formed of an active pixel. However, the type, structure, and/or a drive method of the pixels PXL applicable to a display device is not limited in particular. For example, each pixel PXL may be formed of a pixel of a passive or active light emitting display device having various structures and/or drive methods.

Figure 4:
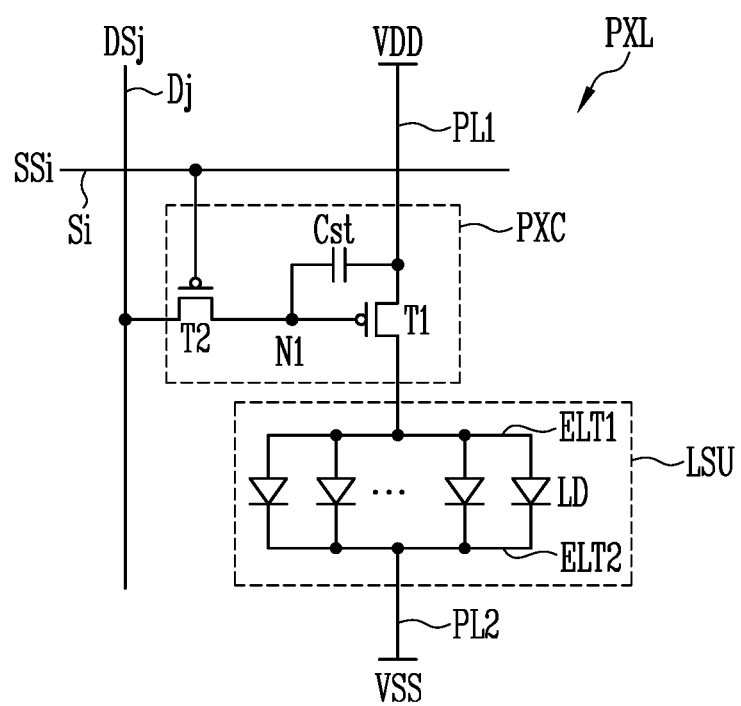
FIGS. 4 to 6 are schematic circuit diagrams of a pixel according to embodiments.
Figure 5:
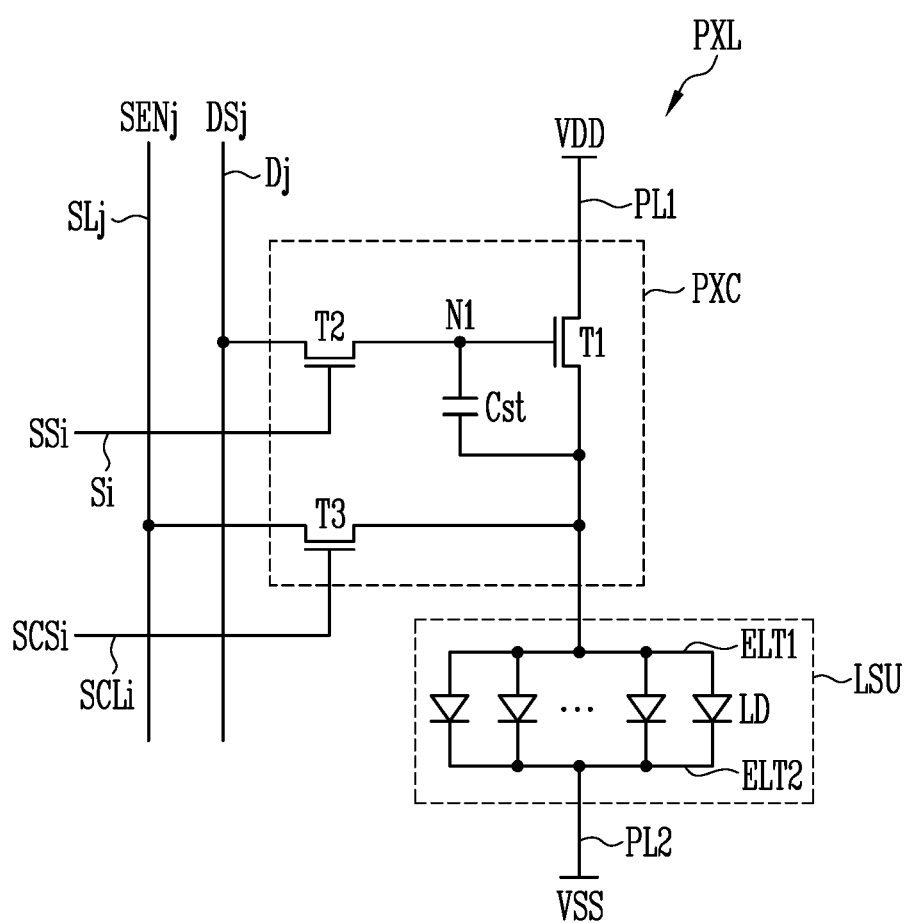
Figure 6:
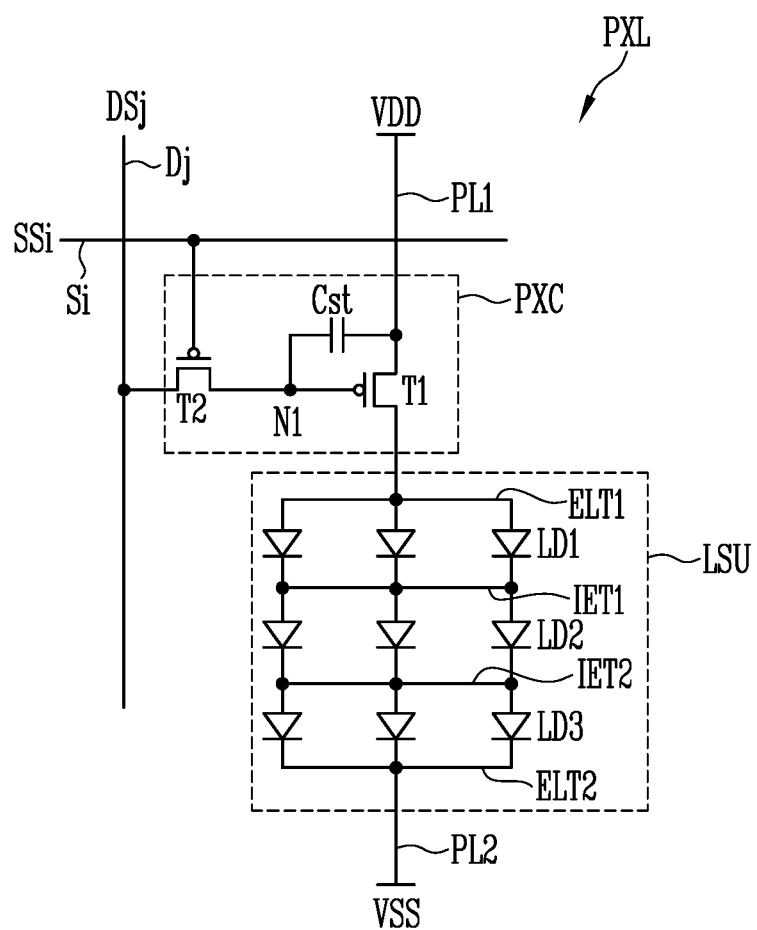

FIGS. 4 to 6 are schematic circuit diagrams illustrating pixels according to an embodiment. For example, FIGS. 4 to 6 illustrate embodiments of the pixel PXL applicable to the active display device. However, the types of the pixel PXL and the display device are not limited thereto.

According to an embodiment, the pixel PXL illustrated in FIGS. 4 to 6 may be one of the first pixel PXL1, the second pixel PXL2, and the third pixel PXL3 included in the display panel PNL of FIG. 3. The first pixel PXL1, the second pixel PXL2, and the third pixel PXL3 may have substantially the same or similar structure(s).

Referring to FIG. 4, the pixel PXL may include a light source unit LSU that generates light with a luminance corresponding to a data signal, and a pixel circuit PXC that drives the light source unit LSU.

The light source unit LSU may include at least one light emitting element LD electrically connected between a first power supply VDD and a second power supply VSS. For example, the light source unit LSU may include a first electrode ELT1 (also referred to as a "first pixel electrode" or a "first alignment electrode") electrically connected to the first power supply VDD via a pixel circuit PXC and a first power line PL1, a second electrode ELT2 (also referred to as a "second pixel electrode" or a "second alignment electrode") electrically connected to the second power supply VSS via a second power line PL2, and light emitting elements LD electrically connected in the same direction between the first electrode ELT1 and the second electrode ELT2. In an embodiment, the first electrode ELT1 may be an anode electrode, and the second electrode ELT2 may be a cathode electrode.

Each of the light emitting elements LD may have a first end (for example, a p-type end) electrically connected to the first power supply VDD via the first electrode ELT1 and/or the pixel circuit PXC, and a second end (for example, an n-type end) electrically connected to the second power supply VSS via the second electrode ELT2. For example, the light emitting elements LD may be electrically connected in parallel in a forward direction between the first electrode ELT1 and the second electrode ELT2. The respective light emitting elements LD electrically connected in the forward direction between the first power supply VDD and the second power supply VSS may form respective effective light sources, and the effective light sources may form the light source unit LSU of the pixel PXL.

The first power supply VDD and the second power supply VSS may have different potentials so that the light emitting elements LD may emit light. In an example, the first power supply VDD may be set as a high potential power supply, and the second power supply VSS may be set as a low potential power supply. In this case, a potential difference between the first power supply VDD and the second power supply VSS may be set to be greater than or equal to threshold voltages of the light emitting elements LD during a light emission period of the pixel PXL.

An end (for example, a p-type end) of the light emitting elements LD forming each light source unit LSU may be electrically connected in common to the pixel circuit PXC via an electrode (for example, the first electrode ELT1 of each pixel PXL) of the light source unit LSU and may be electrically connected to the first power supply VDD via the pixel circuit PXC and the first power line PL1. Another end (for example, n-type end) of each of the light emitting elements LD may be electrically connected in common to the second power supply VSS via another electrode (for example, the second electrode ELT2 of each pixel PXL) of the light source unit LSU and a second power line PL2.

The light emitting elements LD may emit light with a luminance corresponding to a drive current supplied through the pixel circuit PXC. For example, the pixel circuit PXC may supply a drive current corresponding to a gray scale value to be expressed in the corresponding frame to the light source unit LSU during each frame period. The drive current supplied to the light source unit LSU may be divided and flow to the light emitting elements LD electrically connected in the forward direction. Accordingly, while each light emitting element LD emits light with a luminance corresponding to the current flowing therethrough, the light source unit LSU may emit light with a luminance corresponding to the drive current.

The pixel circuit PXC may be electrically connected between the first power supply VDD and the first electrode ELT1. The pixel circuit PXC may be electrically connected to a scan line Si and a data line Dj of the pixel PXL. In an example, in case that the pixel PXL is disposed on an i-th (where i is a natural number) horizontal line (row) and j-th (where j is a natural number) vertical line (column) of the display region DA, the pixel circuit PXC of the pixel PXL may be electrically connected to the i-th scan line Si and the j-th data line Dj of the display region DA.

According to embodiments, the pixel circuit PXC may include transistors and at least one capacitor. For example, the pixel circuit PXC may include a first transistor T1, a second transistor T2, and a storage capacitor Cst.

The first transistor T1 may be electrically connected between the first power supply VDD and the light source unit LSU. For example, a first electrode (for example, a source electrode) of the first transistor T1 may be electrically connected to the first power supply VDD, and a second electrode (for example, a drain electrode) of the first transistor T1 may be electrically connected to the first electrode ELT1. A gate electrode of the first transistor T1 may be electrically connected to a first node N1. The first transistor T1 may control a drive current supplied to the light source unit LSU in response to a voltage of the first node N1. For example, the first transistor T1 may be a drive transistor that controls a drive current of the pixel PXL.

The second transistor T2 may be electrically connected between the data line Dj and the first node N1. For example, a first electrode (for example, a source electrode) of the second transistor T2 may be electrically connected to the data line Dj, and a second electrode (for example, a drain electrode) of the second transistor T2 may be electrically connected to the first node N1. A gate electrode of the second transistor T2 may be electrically connected to the scan line Si. In case that a scan signal SSi of a gate-on voltage (for example, a low level voltage) is supplied from the scan line Si, the second transistor T2 may be turned on to electrically connect the data line Dj to the first node N1.

For each frame period, a data signal DSj of the related frame may be supplied to the data line Dj, and the data signal DSj may be transmitted to the first node N1 through the second transistor T2 which is turned-on during a period in which a scan signal SSi of a gate-on voltage is supplied thereto. For example, the second transistor T2 may be a switching transistor for transmitting each data signal DSj to the pixel PXL.

An electrode of the storage capacitor Cst may be electrically connected to the first power supply VDD, and another electrode may be electrically connected to the first node N1. The storage capacitor Cst may store a voltage corresponding to the data signal DSj supplied to the first node N1 during each frame period.

FIG. 4 illustrates that the transistors included in the pixel circuit PXC, for example, the first and second transistors T1 and T2 are all p-type transistors, but the transistors are not limited thereto. At least one of the first and second transistors T1 and T2 may be changed to an n-type transistor. The pixel circuit PXC may be formed of a pixel circuit having various structures and/or drive methods.

Referring to FIG. 5, the pixel circuit PXC may be further electrically connected to a sensing control line SCLi and a sensing line SLj. In an example, the pixel circuit PXC of the pixel PXL disposed on the i-th horizontal line and the j-th vertical line of the display region DA may be electrically connected to the i-th sensing control line SCLi and the j-th sensing line SLj of the display region DA. The pixel circuit PXC may further include a third transistor T3. In another embodiment, the sensing line SLj may be omitted, and characteristics of the pixels PXL may also be detected by detecting a sensing signal SENj through the data line Dj of the corresponding pixel PXL (or an adjacent pixel).

The third transistor T3 may be electrically connected between the first transistor T1 and the sensing line SLj. For example, an electrode of the third transistor T3 may be electrically connected to an electrode (for example, a source electrode) of the first transistor T1 electrically connected to the first electrode ELT1, and another electrode of the third transistor T3 may be electrically connected to the sensing line SLj. In case that the sensing line SLj is omitted, another electrode of the third transistor T3 may be electrically connected to the data line Dj.

A gate electrode of the third transistor T3 may be electrically connected to the sensing control line SCLi. In case that the sensing control line SCLi is omitted, the gate electrode of the third transistor T3 may be electrically connected to the scan line Si. The third transistor T3 may be turned on by a sensing control signal SCSi having a gate-on voltage (for example, a high level voltage) supplied to the sensing control line SCLi during a sensing period to electrically connect the sensing line SLj to the first transistor T1.

According to the embodiment, a sensing period may be a period in which characteristics (for example, a threshold voltage of the first transistor T1) of the pixels PXL disposed in the display region DA are extracted (or sensed). During the sensing period, a reference voltage for turning on the first transistor T1 may be supplied to the first node N1 through the data line Dj and the second transistor T2, or each of the pixels PXL may be electrically connected to a current source or the like to turn on the first transistor T1. The sensing control signal SCSi having a gate-on voltage may be supplied to the third transistor T3 to turn on the third transistor T3, and thus the first transistor T1 may be electrically connected to the sensing line SLj. The sensing signal SENj may be obtained through the sensing line SLj, and characteristics of the pixels PXL including a threshold voltage of the first transistor T1, or the like may be detected by using the sensing signal SENj. Information on the characteristics of the pixels PXL may be used to convert image data so that a characteristic difference between the pixels PXL arranged in the display region DA may be compensated for.

FIG. 5 illustrates an embodiment in which the first, second, and third transistors T1, T2, and T3 are all n-type transistors, but the disclosure is not limited thereto. For example, at least one of the first, second, and third transistors T1, T2, and T3 may be changed to a p-type transistor.

FIGS. 4 and 5 illustrate an embodiment in which effective light sources forming each light source unit LSU, that is, all the light emitting elements LD are electrically connected in parallel, but the embodiment is not limited thereto. For example, as illustrated in FIG. 6, the light source unit LSU of each of the pixels PXL may include at least two stages in series. In describing the embodiments of FIG. 6, detailed descriptions on a configuration (for example, the pixel circuit PXC) similar or identical to those of the embodiments of FIGS. 4 and 5 will be omitted.

Referring to FIG. 6, the light source unit LSU may include at least two light emitting elements electrically connected in series to each other. For example, the light source unit LSU may include a first light emitting element LD1, a second light emitting element LD2, and a third light emitting element LD3 electrically connected in series in a forward direction between the first power supply VDD and the second power supply VSS. The first, second, and third light emitting elements LD1, LD2, and LD3 may constitute respective effective light sources.

Hereinafter, when indicating a specific light emitting device among the first, second, and third light emitting elements LD1, LD2, LD3, the related light emitting device may be referred to as the "first light emitting element LD1," the "second light emitting element LD2," or the "third light emitting element LD3." At least one of the first, second, and third light emitting elements LD1, LD2, and LD3 may be randomly referred to as a "light emitting element LD," and the first, second, and third light emitting elements LD1, LD2, and LD3 may be collectively referred to as "light emitting elements LD."

A first end (for example, a p-type end) of the first light emitting element LD1 may be electrically connected to the first power supply VDD through the first electrode (for example, a first pixel electrode) ELT1 of the light source unit LSU. The second end (for example, an n-type end) of the first light emitting element LD1 may be electrically connected to a first end (for example, a p-type end) of the second light emitting element LD2 through a first intermediate electrode IET1.

The first end of the second light emitting element LD2 may be electrically connected to the second end of the first light emitting element LD1. A second end (for example, an n-type end) of the second light emitting element LD2 may be electrically connected to a first end (for example, a p-type end) of the third light emitting element LD3 through a second intermediate electrode IET2.

The first end of the third light emitting element LD3 may be electrically connected to the second end of the second light emitting element LD2. A second end (for example, an n-type end) of the third light emitting element LD3 may be electrically connected to the second power supply VSS through the second electrode (for example, the second pixel electrode) ELT2 or the like of the light source unit LSU. In the above-described manner, the first, second, and third light emitting elements LD1, LD2, and LD3 may be sequentially connected in series between the first and second electrodes ELT1 and ELT2 of the light source unit LSU.

FIG. 6 illustrates an embodiment in which the light emitting elements LD are electrically connected in a series structure of three stages, but the embodiment is not limited thereto, and two light emitting elements LD may be electrically connected in a series structure of two stages, or four or more light emitting elements LD may be electrically connected in a series structure of four or more stages.

Assuming that the same luminance is expressed (or displayed) by using light emitting elements LD having the same configuration (for example, the same size and/or number), a voltage applied between the first and second electrodes ELT1 and ELT2 may increase in the light source unit LSU having a structure in which the light emitting elements LD are electrically connected in series, and a drive current flowing through the light source unit LSU may decrease, as compared to the light source unit LSU having a structure in which the light emitting elements LD are electrically connected in parallel. Therefore, in case that the light source unit LSU of each pixel PXL is formed by applying the series structure, the panel current flowing through the display panel PNL may be reduced.

As in the above-described embodiments, each light source unit LSU may include light emitting elements LD constituting respective effective light sources connected in a forward direction between the first and second power supplies VDD and VSS. The connection structure between the light emitting elements LD may be variously changed according to embodiments. For example, the light emitting elements LD may be electrically connected to each other only in series or parallel or may be electrically connected in a series-parallel mixed structure.

Figure 7:
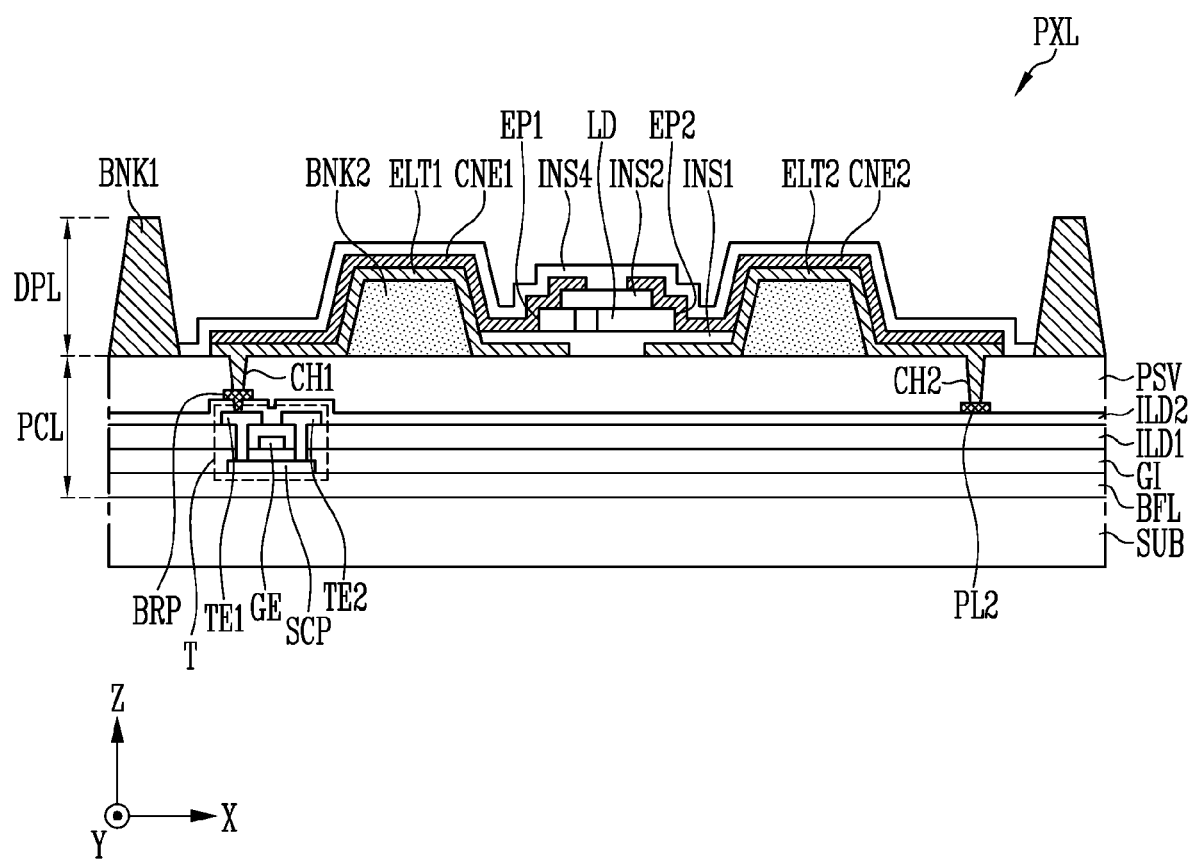
FIGS. 7 and 8 are schematic cross-sectional views of a pixel according to embodiments.
Figure 8:
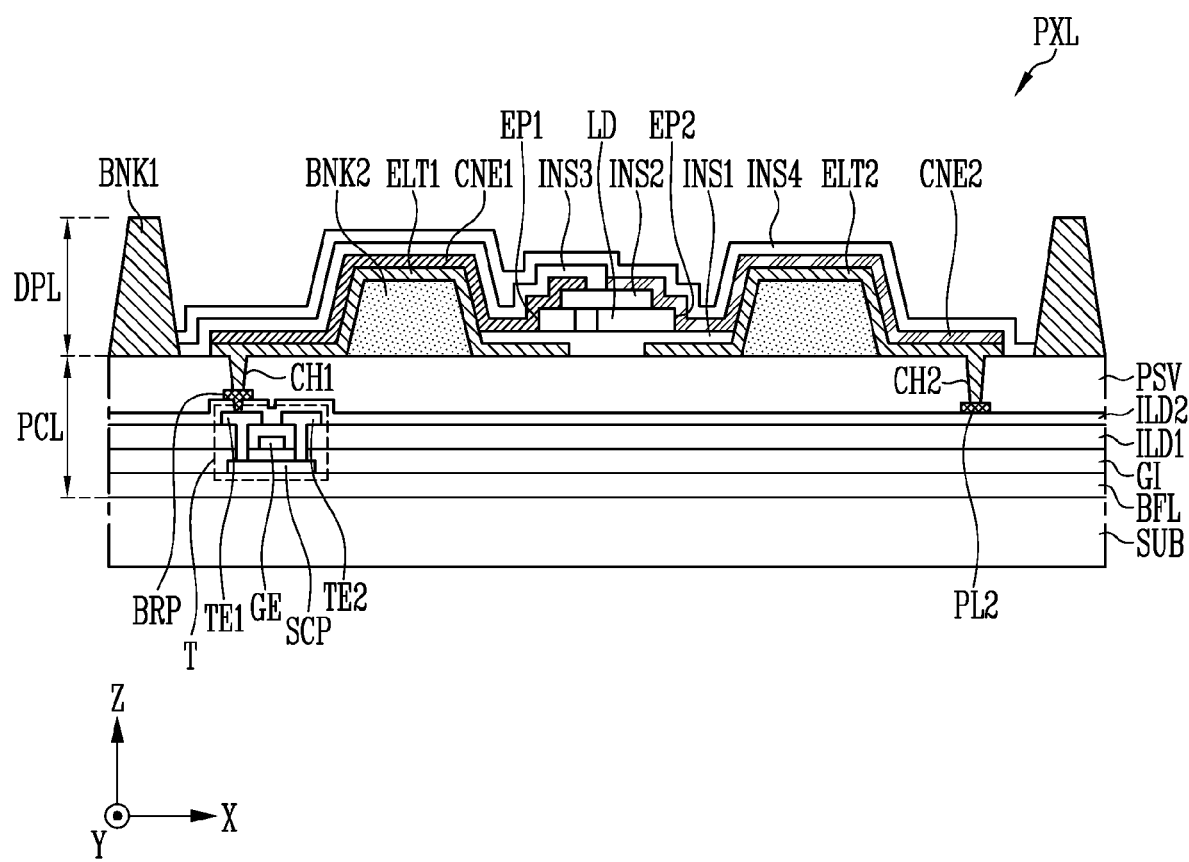

FIGS. 7 and 8 are schematic cross-sectional views of a pixel according to embodiments.

FIGS. 7 and 8 schematically illustrate structures of each pixel PXL, with the light emitting element LD being in the center, and illustrate a transistor T electrically connected to the first electrode ELT1 among various circuit elements forming the pixel circuit PXC. Hereinafter, in case that it is not necessary to distinguish the first transistor T1 from other transistors, the first transistor T1 may be collectively referred to as a "transistor T."

The structures of the transistors T and/or the positions of the layers are not limited to the embodiments illustrated in FIGS. 7 and 8 and may be variously changed according to the embodiments. In an embodiment, the transistor(s) T of each pixel circuit PXC may have substantially the same or similar structure(s) but are not limited thereto. For example, in another embodiment, at least one of the transistors T of the pixel circuit PXC may have a cross-sectional structure different from that of other transistors T and/or may also be disposed on a different layer.

Referring to FIGS. 7 and 8, the pixel PXL and a display device including the same may include the substrate SUB, and a circuit layer PCL and a display layer DPL disposed on one surface of the substrate SUB. According to the embodiment, a color conversion layer and/or a color filter layer may be further disposed on the display layer DPL but is not limited thereto.

The circuit layer PCL may include circuit elements forming the pixel circuit PXC of each pixel PXL and various wires electrically connected thereto. The display layer DPL may include electrodes (for example, first and second electrodes ELT1 and ELT2 and/or first and second contact electrodes CNE1 and CNE2) included in the light source unit LSU of each pixel PXL and the light emitting elements LD.

The circuit layer PCL may include at least one circuit element electrically connected to the light emitting elements LD of each pixel PXL. For example, the circuit layer PCL may include the transistors T that are disposed in each pixel region and are included in the pixel circuit PXC of the pixel PXL. The circuit layer PCL may further include at least one power supply line and/or at least one signal line electrically connected to each pixel circuit PXC and/or to the light source unit LSU. For example, the circuit layer PCL may include the first power line PL1, the second power line PL2, and the scan line Si and the data line Dj of each pixel PXL.

The circuit layer PCL may include insulating layers. For example, the circuit layer PCL may include a buffer layer BFL, a gate insulating layer GI, a first interlayer insulating layer ILD1, a second interlayer insulating layer ILD2, and/or a passivation layer PSV which are sequentially stacked on a surface of the substrate SUB. The circuit layer PCL may selectively further include at least one light blocking pattern (not illustrated) or the like disposed under at least some of the transistors T.

The buffer layer BFL may prevent diffusion of impurities into each circuit element. The buffer layer BFL may be formed of a single layer or may be formed of at least two or more multiple layers. In case that the buffer layer BFL is provided as multiple layers, the multiple layers may be formed of the same material or may be formed of different materials. Various circuit elements such as the transistors T and various wires electrically connected to the circuit elements may be disposed on the buffer layer BFL. The buffer layer BFL may be omitted according to embodiments.

Each transistor T may include a semiconductor pattern SCP (also referred to as a "semiconductor layer" or an "active layer"), a gate electrode GE, and first and second transistor electrodes TE1 and TE2. FIGS. 7 and 8 illustrate an embodiment in which each transistor T includes the first and second transistor electrodes TE1 and TE2 formed separately from the semiconductor pattern SCP, but the embodiments are not limited thereto. For example, in another embodiment, the first and/or second transistor electrodes TE1 and/or TE2 provided in at least one transistor T may be integral with each semiconductor pattern SCP.

The semiconductor pattern SCP may be disposed on the buffer layer BFL. For example, the semiconductor pattern SCP may be disposed between the gate insulating layer GI and the substrate SUB on which the buffer layer BFL is formed. The semiconductor pattern SCP may include a first region contacting each first transistor electrode TE1, a second region contacting each second transistor electrode TE2, and a channel region between the first and second regions. According to an embodiment, one of the first and second regions may be a source region, and the other may be a drain region.

According to the embodiment, the semiconductor pattern SCP may be a semiconductor pattern formed of polysilicon, amorphous silicon, oxide semiconductor, or the like. The channel region of the semiconductor pattern SCP may be a semiconductor pattern that is not doped with impurities and may be an intrinsic semiconductor, and the first and second regions of the semiconductor pattern SCP may be a semiconductor pattern doped with a predetermined impurity.

In an embodiment, the semiconductor patterns SCP of the transistors T included in each pixel circuit PXC may be formed of substantially the same material or similar materials. For example, the semiconductor pattern SCP of the transistor T may be formed of the same material among polysilicon, amorphous silicon, and oxide semiconductor.

In another embodiment, some of the transistors T and some of other transistors T may also include the semiconductor patterns SCP formed of different materials. For example, the semiconductor pattern SCP of some of the transistors T may be formed of polysilicon or amorphous silicon, and the semiconductor pattern SCP of the rest of the transistors T may be formed of oxide semiconductor.

The gate insulating layer GI may be disposed on the semiconductor pattern SCP. For example, the gate insulating layer GI may be disposed between the semiconductor pattern SCP and the gate electrode GE. The gate insulating layer GI may be formed of a single layer or multiple layers and include various types of organic and/or inorganic insulating materials including silicon nitride ($SiN_x$), silicon oxide ($SiO_x$), or silicon oxynitride ($SiO_xN_y$).

The gate electrode GE may be disposed on the gate insulating layer GI. For example, the gate electrode GE may be disposed to overlap the semiconductor pattern SCP with the gate insulating layer GI interposed therebetween. FIGS. 7 and 8 illustrate the transistor T having a top-gate structure, but in another embodiment, the transistor T may have a bottom-gate structure. In this case, the gate electrode GE may be disposed under the semiconductor pattern SCP to overlap the semiconductor pattern SCP.

The first interlayer insulating layer ILD1 may be disposed on the gate electrode GE. For example, the first interlayer insulating layer ILD1 may be disposed between the gate electrode GE and the first and second transistor electrodes TE1 and TE2. The first interlayer insulating layer ILD1 may be formed of a single layer or multiple layers and may include at least one inorganic insulating material and/or an organic insulating material. For example, the first interlayer insulating layer ILD1 may include various types of organic and/or inorganic insulating materials including silicon nitride ($SiN_x$), silicon oxide ($SiO_x$), or silicon oxynitride ($SiO_xN_y$), and the first interlayer insulating layer ILD1 is not limited in particular.

The first and second transistor electrodes TE1 and TE2 may be disposed on each semiconductor pattern SCP with at least one first interlayer insulating layer ILD1 interposed therebetween. For example, the first and second transistor electrodes TE1 and TE2 may be disposed on different ends of the semiconductor pattern SCP with the gate insulating layer GI and the first interlayer insulating layer ILD1 interposed therebetween. The first and second transistor electrodes TE1 and TE2 may be electrically connected to the respective semiconductor patterns SCP. For example, the first and second transistor electrodes TE1 and TE2 may be electrically connected to the first and second regions of the semiconductor pattern SCP, respectively, through respective contact holes penetrating through the gate insulating layer GI and the first interlayer insulating layer ILD1. According to an embodiment, one of the first and second transistor electrodes TE1 and TE2 may be a source electrode, and the other may be a drain electrode.

At least one transistor T provided in the pixel circuit PXC may be electrically connected to at least one pixel electrode. For example, the transistor T may be electrically connected to the first electrode ELT1 of the related pixel (or corresponding pixel) PXL through a contact hole (for example, a first contact hole CH1) penetrating through the passivation layer PSV, and/or a bridge pattern BRP.

In an embodiment, at least one signal line and/or at least one power line electrically connected to each pixel PXL and an electrode of each of circuit elements of the pixel circuit PXC may be disposed on the same layer. For example, the scan line Si of each pixel PXL and the gate electrodes GE of the transistors T may be disposed on the same layer, and the data line Dj of each pixel PXL and the first and second transistor electrodes TE1 and TE2 of the transistors T may be disposed on the same layer.

The first and/or second power lines PL1 and/or PL2 and the gate electrodes GE of the transistors T or the first and second transistor electrodes TE1 and TE2 may be disposed on the same layer different layer(s). For example, the second power line PL2 for supplying the second power supply VSS may be disposed on the second interlayer insulating layer ILD2 and may be covered or overlapped at least partially by the passivation layer PSV. The second power line PL2 may be electrically connected to the second electrode ELT2 of the light source unit LSU disposed on the passivation layer PSV through a second contact hole CH2 penetrating through the passivation layer PSV. However, the position and/or structure of the first and/or second power lines PL1 and PL2 may be variously changed. For example, the second power line PL2 and the gate electrodes GE of the transistors T or the first and second transistor electrodes TE1 and TE2 may be disposed on the same layer. The second power line PL2 may be electrically connected to the second electrode ELT2 through at least one bridge pattern (not illustrated) and/or the second contact hole CH2.

The second interlayer insulating layer ILD2 may be disposed on the first interlayer insulating layer ILD1 and overlap the first and second transistor electrodes TE1 and TE2 located on the first interlayer insulating layer ILD1. The second interlayer insulating layer ILD2 may be formed of a single layer or multiple layers and may include at least one inorganic insulating material and/or an organic insulating material. For example, the second interlayer insulating layer ILD2 may include various types of organic and/or inorganic insulating materials including silicon nitride ($SiN_x$), silicon oxide ($SiO_x$), or silicon oxynitride ($SiO_xN_y$) but is not limited thereto.

The bridge pattern BRP for connecting at least one circuit element (for example, the first transistor T1) provided in the pixel circuit PXC to the first electrode ELT1, the first power line PL1, and/or the second power line PL2 may be disposed on the second interlayer insulating layer ILD2. However, the second interlayer insulating layer ILD2 may be omitted according to embodiments. In this case, the bridge pattern BRP of FIGS. 7 and 8 may be omitted, and the second power line PL2 may be disposed on a layer in which an electrode of the transistor T is disposed.

The passivation layer PSV may be disposed on circuit elements including the transistors T and/or wires including the first and second power lines PL1 and PL2. The passivation layer PSV may be formed of a single layer or multiple layers and may include at least one inorganic insulating material and/or an organic insulating material. For example, the passivation layer PSV may include at least an organic insulating layer and may substantially planarize a surface of the circuit layer PCL.

The display layer DPL may be disposed on the passivation layer PSV of the circuit layer PCL. The display layer DPL may include a first bank BNK1 defining a light emission region of each pixel PXL, at least a pair of the first and second electrodes ELT1 and ELT2 that are disposed in a light emission region of each pixel PXL and are included in each light source unit LSU, and at least one light emitting element LD electrically connected between the first electrode ELT1 and the second electrode ELT2. FIGS. 7 and 8 illustrate a light emitting element LD disposed in each pixel PXL, but each pixel PXL may include light emitting elements LD electrically connected between the first and second electrodes ELT1 and ELT2 as in the embodiments of FIG. 4 or the like. Therefore, each embodiment will be described below, assuming that the pixel PXL includes light emitting elements LD.

The display layer DPL may further include the first and second contact electrodes CNE1 and CNE2 for more stably connecting the light emitting elements LD between the first and second electrodes ELT1 and ELT2, and a second bank BNK2 for making a region of each of the first and second electrodes ELT1 and ELT2 and/or the first and second contact electrodes CNE1 and CNE2 protrude upward.

The first bank BNK1 may be disposed to surround a light emission region of the pixels PXL. For example, the first bank BNK1 may be disposed in a boundary region between the respective pixel regions in which the pixels PXL are provided and/or in a region between adjacent pixels PXL. The first bank BNK1 may include an opening defining a light emission region of the pixel PXL. As respective light emission regions are partitioned by the first bank BNK1, light emitting elements LD which will be described below may be supplied to the respective light emission regions. For example, the first bank BNK1 may function as a dam structure defining the respective light emission regions to which the light emitting elements LD have to be supplied in an operation of supplying the light emitting elements LD.

In an embodiment, each of the first banks BNK1 may include conductive polymer and a scattering material dispersed in the conductive polymer. For example, the conductive polymer may include one of polyfluorene, polyphenylene, polypyrene, polyazulene, polynaphthalene, polyacetylene (PAC), poly(p-phenylene vinylene) (PPV), polypyrrole (PPY), polycarbazole, polyindole, polythienylenevinylene, polyaniline (PANI), polythiophene, poly(p-phenylene sulfide) (PPS), poly(3,4-ethylenedioxythiophene) (PEDOT), poly(3,4-ethylenedioxythiophene) polystyrene sulfonate (PEDOT:PSS) doped with polystyrene sulfonate (PSS), poly(3,4-ethylenedioxythiophene)-tetramethacrylate (PEDOT-TMA), and polyfuran but is not limited thereto. The scattering material may include at least one of barium sulfate ($BaSO_4$), calcium carbonate ($CaCO_3$), titanium oxide ($TiO_x$), aluminum oxide ($AlO_x$), zirconium oxide ($ZrO_x$), and zinc oxide ($ZnO_x$). As described above, in case that the first bank BNK1 is formed of the conductive polymer including the scattering material, the first bank BNK1 may guide light emitted from the light emitting element LD in a front direction of the display panel PNL, for example, in a third direction (Z-axis direction), and thus, the light emission efficiency of a front surface of a display device may be increased. The first bank BNK1 and the first and second electrodes ELT1 and ELT2 may be simultaneously formed by the same process which will be described below. In this case, the number of masks may be reduced, resulting in a reduction in cost and simplification of a manufacturing process. Detailed descriptions thereof will be made below with reference to FIGS. 10 to 17.

The second bank BNK2 may be disposed on the circuit layer PCL in the light emission region of each pixel PXL. The second bank BNK2 may be formed in a separate or integral pattern. The second bank BNK2 may protrude in a height direction of the substrate SUB, for example, the third direction (Z-axis direction).

The second bank BNK2 may have various shapes according to embodiments. In an embodiment, the second bank BNK2 may be a bank structure having a positively tapered structure. For example, the second bank BNK2 may be formed to have an inclined surface inclined at an angle with respect to the substrate SUB as illustrated in FIGS. 7 and 8. However, the embodiment is not limited thereto, and the second bank BNK2 may have a curved or stepped sidewall. For example, the second bank BNK2 may also have a cross section such as a semi-circular or semi-elliptical shape.

Electrodes and insulating layers disposed on the second bank BNK2 may have a shape corresponding to the second bank BNK2. For example, the first and second electrodes ELT1 and ELT2 and the first and second contact electrodes CNE1 and CNE2 may be disposed over a region of the second bank BNK2 and may include an inclined surface or a curved surface having a shape corresponding to the shape of the second bank BNK2. Likewise, the first, third, and/or fourth insulating layers INS1, INS3, and INS4 may be disposed on the second bank BNK2 to include an inclined surface or a curved surface having a shape corresponding to that of the second bank BNK2.

The second bank (BNK2) may include a transparent organic insulating material such as polyimide resin, polyamide resin, acrylic resin, epoxy resin, phenolic resin, unsaturated polyester resin, polyphenylenether resin, polyphenylenesulfide resin, or benzocyclobutene (BCB), but is not limited thereto. The second bank BNK2 may include an inorganic insulating material such as silicon oxide ($SiO_x$), silicon nitride ($SiN_x$), silicon oxynitride ($SiO_xN_y$), aluminum oxide ($AlO_x$), or titanium oxide ($TiO_x$) or may be formed of an organic-inorganic composite layer.

In an embodiment, the second bank BNK2 may guide light emitted from each of the light emitting elements LD in a front direction of the display panel PNL, for example, in the third direction (Z-axis direction), together with the first and second electrodes ELT1 and ELT2 provided on the second bank BNK2, and thus, light emission efficiency of a front surface of the display device may be increased.

The first and second electrodes ELT1 and ELT2 of pixel electrodes of each pixel PXL may be disposed on the second bank BNK2. The first and second electrodes ELT1 and ELT2 may be directly disposed on the second bank BNK2 to cover or overlap the second bank BNK2. The first and second electrodes ELT1 and ELT2 may be disposed in the respective pixel regions where the pixels PXL are provided and/or formed. For example, the first and second electrodes ELT1 and ELT2 may be disposed side by side by being spaced apart from each other by a predetermined interval (or distance) in the light emission regions of the respective pixels PXL.

According to the embodiment, the first and/or second electrodes ELT1 and ELT2 may have a pattern separated for each pixel PXL or a pattern electrically connected in common to the pixels PXL. Before a process of forming the pixel PXL, particularly, before alignment of the light emitting elements LD is completed, the first electrodes ELT1 of the pixels PXL disposed in the display region DA may be electrically connected to each other, and the second electrodes ELT2 of the pixels PXL may be electrically connected to each other. For example, before the alignment of the light emitting elements LD is completed, the first electrodes ELT1 of the pixels PXL may be formed integrally or non-integrally with each other to be electrically connected to each other, and the second electrodes ELT2 of the pixels PXL may be integral or not integral with each other to be electrically connected to each other. In case that the first electrodes ELT1 or the second electrodes ELT2 of the pixels PXL are non-integrally with and electrically connected to each other, the first electrodes ELT1 or the second electrodes ELT2 may be electrically connected to each other by at least one contact hole and/or at least one bridge pattern, or the like.

The first and second electrodes ELT1 and ELT2 may each receive a first alignment signal (or a first alignment voltage) and a second alignment signal (or a second alignment voltage) in an operation of aligning the light emitting elements LD. For example, one of the first and second electrodes ELT1 and ELT2 may receive an AC alignment signal, and the other of the first and second electrodes ELT1 and ELT2 may receive an alignment voltage (for example, a ground voltage) of a predetermined voltage level. For example, a predetermined alignment signal may be applied to the first and second electrodes ELT1 and ELT2 in the alignment step of the light emitting elements LD. Accordingly, an electric field may be formed between the first and second electrodes ELT1 and ELT2. The light emitting elements LD supplied to each pixel region (particularly, light emission region of each pixel PXL) may self-align between the first and second electrodes ELT1 and ELT2 by the electric field. After the alignment of the light emitting elements LD is completed, at least the first electrodes ELT1 of the pixels PXL may be electrically disconnected from each other so that the pixels PXL may be individually driven.

The first electrode ELT1 may be electrically connected to a circuit element (for example, at least one transistor included in the pixel circuit PXC), a power line (for example, the first power line PL1), and/or a signal line (for example, the scan line Si, the data line Dj, or a control line) through the first contact hole CH1. In an embodiment, the first electrode ELT1 may be electrically connected to the bridge pattern BRP through the first contact hole CH1 and may be electrically connected to the transistor T therethrough but is not limited thereto. The first electrode ELT1 may also be directly connected to a power line or a signal line.

The second electrode ELT2 may include a circuit element (for example, at least one transistor included in the pixel circuit PXC), a power line (for example, a second power line PL2) and/or a signal line (for example, a scan line Si, a data line Dj, or a control line) through the second contact hole CH2. In an embodiment, the second electrode ELT2 may be electrically connected to the second power line PL2 through the second contact hole CH2. However, the disclosure is not limited thereto, and the second electrode ELT2 may be directly and electrically connected to a power line or signal line.

In an embodiment, the first and second electrodes ELT1 and ELT2 and the above-described first bank BNK1 may include the same material. For example, the first and second electrodes ELT1 and ELT2 may each include a conductive polymer and a scattering material dispersed in the conductive polymer. The conductive polymer may include at least one of polyfluorene, polyphenylene, polypyrene, polyazulene, polynaphthalene, polyacetylene (PAC), poly-p-phenylene vinylene (PPV), polypyrrole (PPY), polycarbazole, polyindole, polythienylenevinylene, polyaniline (PANI), polythiophene, poly(p-phenylene sulfide) (PPS), poly(3,4-ethylenedioxy thiophene) (PEDOT), poly(3,4-ethylenedioxythiophene) polystyrene sulfonate (PEDOT:PSS), doped with polystyrene sulfonate (PSS), poly(3,4-ethylenedioxy thiophene)-tetramethacrylate (PEDOT-TMA), and polyfuran but is not limited thereto. The scattering material may include at least one of barium sulfate (BaSO$_4$), calcium carbonate (CaCO$_3$), titanium oxide (TiO$_x$), aluminum oxide (AlO$_x$), zirconium oxide (ZrO$_x$), and zinc oxide (ZnO$_x$). As described above, in case that the first and second electrodes ELT1 and ELT2 are formed of the conductive polymer including the scattering material, the first and second electrodes ELT1 and ELT2 may guide light emitted from the light emitting element LD in a front direction of the display panel PNL, for example, in the third direction (Z-axis direction), and thus, light emission efficiency of a front surface of a display device may be increased. The first and second electrodes ELT1 and ELT2 and the first bank BNK1 may be simultaneously formed by the same process, and thus, the number of masks may be reduced, resulting in a reduction in cost and simplification of a manufacturing process. Detailed descriptions thereof will be made below with reference to FIGS. 10 to 17.

The first insulating layer INS1 may be disposed on the first and second electrodes ELT1 and ELT2. For example, the first insulating layer INS1 may be formed to cover or overlap a region of each of the first and second electrodes ELT1 and ELT2 and may include an opening for exposing another region of each of the first and second electrodes ELT1 and ELT2. For example, the first insulating layer INS1 may include an opening formed on an upper surface of the second bank BNK2. The first and second electrodes ELT1 and ELT2 may be electrically connected to the first and second contact electrodes CNE1 and CNE2, respectively, in a region in which the first insulating layer INS1 is opened.

The first insulating layer INS1 may be formed of a single layer or multiple layers and may include at least one inorganic insulating material and/or an organic insulating material. In an embodiment, the first insulating layer INS1 may include various types of inorganic insulating materials including silicon nitride (SiN$_x$), silicon oxide (SiO$_x$), silicon oxynitride (SiO$_x$N$_y$), or aluminum oxide (AlO$_x$). In another embodiment, the first insulating layer INS1 may include a scattering material dispersed in a polymer resin. For example, the polymer resin may include polyimide resin, polyamide resin, acrylic resin, epoxy resin, phenolic resin, unsaturated polyester resin, polyphenylenether resin, polyphenylenesulfide resin, benzocyclobutene (BCB), or the like but is not limited thereto. The scattering material may include at least one of barium sulfate (BaSO$_4$), calcium carbonate (CaCO$_3$), titanium oxide (TiO$_x$), aluminum oxide (AlO$_x$), zirconium oxide (ZrO$_x$), and zinc oxide (ZnO$_x$). For example, the scattering material included in the first insulating layer INS1 may include the same material as the scattering material included in the first bank BNK1, the first electrode ELT1, and the second electrode ELT2 described above but is not limited thereto. Therefore, in case that the first insulating layer INS1 is formed of a polymer resin including a scattering material, light emitted to a lower portion of the light emitting element LD may be recycled or reflected by the first insulating layer INS1 and may be emitted in a front direction of the display panel PNL, for example, in the third direction (Z-axis direction). For example, as the amount of light lost to the lower portion of the display panel PNL may be minimized (or reduced), light emission efficiency of a front surface of the display device may be increased.

The light emitting elements LD may be supplied and aligned on the first and second electrodes ELT1 and ELT2 and the first insulating layer INS1. The light emitting elements LD may be supplied to the respective pixel regions in which the first bank BNK1, the first and second electrodes ELT1 and ELT2, the first insulating layer INS1, or the like are formed, and may be aligned between the first and second electrodes ELT1 and ELT2. For example, multiple light emitting elements LD may be supplied to the light emission region of each pixel PXL by an inkjet method, a slit coating method, or various other methods, and the light emitting elements LD may be directionally aligned between the first and second electrodes ELT1 and ELT2 by an alignment signal (or alignment voltage) applied to each of the first and second electrodes ELT1 and ELT2.

In an embodiment, at least some of the light emitting elements LD may be disposed between a pair of the first and second electrodes ELT1 and ELT2 to overlap the pair of first and second electrodes ELT1 and ELT2 having both ends (which are first and second ends EP1 and EP2) adjacent to each other. In another embodiment, at least some of the light emitting elements LD may be disposed between a pair of the first and second electrodes ELT1 and ELT2 adjacent thereto so as not to overlap the first and/or second electrodes ELT1 and ELT2 and may also be electrically connected to the pair of first and second electrodes ELT1 and ELT2 through the first and second contact electrodes CNE1 and CNE2, respectively. The respective light emitting elements LD electrically connected between the first and second electrodes ELT1 and ELT2 may form effective light sources of the related pixel PXL. The effective light sources may constitute the light source unit LSU of the related pixel PXL.

The second insulating layer INS2 may be disposed on a region of each of the light emitting elements LD. For example, the second insulating layer INS2 may be disposed on a region of each of the light emitting elements LD to expose the first and second ends EP1 and EP2 of each of the light emitting elements LD. In an example, the second insulating layer INS2 may be locally disposed on a region including a central region of each of the light emitting elements LD. In case that the second insulating layer INS2 is formed on the light emitting elements LD after alignment of the light emitting elements LD is completed, it is possible to prevent the light emitting elements LD from being displaced from the aligned position.

The second insulating layer INS2 may be formed in an independent pattern in the light emission region of each pixel PXL but is not limited thereto. According to the embodiment, the second insulating layer INS2 may also be omitted, and in this case, an end of each of the first and second contact electrodes CNE1 and CNE2 may be located directly on an upper surface of the light emitting element LD.

The second insulating layer INS2 may be formed of a single layer or multiple layers and may include at least one inorganic insulating material and/or an organic insulating material. For example, the second insulating layer INS2 may include various types of organic and inorganic insulating materials, including silicon nitride (SiN$_x$), silicon oxide (SiO$_x$), aluminum oxide (AlO$_x$), photoresist (PR) material, and so on.

Both ends of the light emitting elements LD that are not covered or overlapped by the second insulating layer INS2, for example, the first and second ends EP1 and EP2 may be respectively overlapped by the first and second contact electrodes CNE1 and CNE2. The first and second contact electrodes CNE1 and CNE2 may be formed to be spaced apart from each other. For example, the adjacent first and second contact electrodes CNE1 and CNE2 may be disposed on the first and second ends EP1 and EP2 of at least one adjacent light emitting element LD to be spaced apart from each other, with the second insulating layer INS2 therebetween.

The first and second contact electrodes CNE1 and CNE2 may be disposed on the first and second electrodes ELT1 and ELT2 to overlap exposed regions of the first and second electrodes ELT1 and ELT2, respectively. For example, the first and second contact electrodes CNE1 and CNE2 may be disposed on at least one region of each of the first and second electrodes ELT1 and ELT2 to directly or indirectly contact each of the first and second electrodes ELT1 and ELT2 above or around the second bank BNK2. Accordingly, the first and second contact electrodes CNE1 and CNE2 may be electrically connected to the first and second electrodes ELT1 and ELT2, respectively. For example, each of the first and second electrodes ELT1 and ELT2 may be electrically connected to a first or second end EP1 or EP2 of at least one light emitting element LD adjacent thereto through the first and second contact electrodes CNE1 and CNE2.

In an embodiment, the first and second contact electrodes CNE1 and CNE2 may be disposed on the same layer on a surface of the substrate SUB as illustrated in FIG. 7. For example, the first and second contact electrodes CNE1 and CNE2 may be formed of the same conductive layer. In this case, the first and second contact electrodes CNE1 and CNE2 may be simultaneously formed by the same process, and thus, a manufacturing process of the pixel PXL and a display device including the pixel PXL may be simplified. In another embodiment, the first and second contact electrodes CNE1 and CNE2 may be sequentially formed on different layers, as illustrated in FIG. 8. In this case, a third insulating layer INS3 may be disposed between the first contact electrode CNE1 and the second contact electrode CNE2. The order of formation of the first and second contact electrodes CNE1 and CNE2 may vary in some embodiments.

The first and second contact electrodes CNE1 and CNE2 may be formed of various transparent conductive materials. For example, the first and second contact electrodes CNE1 and CNE2 may include at least one of various transparent conductive materials including indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), gallium tin oxide (GTO), and fluorine tin oxide (FTO) and may be formed transparently or semi-transparently to substantially satisfy a predetermined transmittance. Accordingly, light emitted from the light emitting elements LD through each of the first and second ends EP1 and EP2 may be emitted to the outside of the display panel PNL by passing through the first and second contact electrodes CNE1 and CNE2.

The third insulating layer INS3 may be disposed between the first contact electrode CNE1 and the second contact electrode CNE2. In case that the third insulating layer INS3 is formed between the first contact electrode CNE1 and the second contact electrode CNE2 in this way, electrical stability between the first and second ends EP1 and EP2 of the light emitting elements LD may be ensured. For example, the first and second contact electrodes CNE1 and CNE2 may be stably separated or electrically disconnected by the third insulating layer INS3. Accordingly, it is possible to effectively prevent the first and second ends EP1 and EP2 of the light emitting elements LD from being short-circuited.

The third insulating layer INS3 may be formed of a single layer or multiple layers and may include at least one inorganic insulating material and/or an organic insulating material. For example, the third insulating layer INS3 may include various types of organic and inorganic insulating materials, including silicon nitride ($SiN_x$), silicon oxide ($SiO_x$), aluminum oxide ($AlO_x$), photoresist (PR) materials, and so on.

A fourth insulating layer INS4 may be disposed on the first and second contact electrodes CNE1 and CNE2 and/or the third insulating layer INS3. For example, the fourth insulating layer INS4 may cover (or overlap) the second bank BNK2, the first and second electrodes ELT1 and ELT2, the first, second, and/or third insulating layers INS1, INS2, and/or INS3, the light emitting elements LD, and the first and second contact electrodes CNE1 and CNE2. The fourth insulating layer INS4 may include at least one layer of an inorganic film and/or an organic film.

The fourth insulating layer INS4 may be formed of a single layer or multiple layers and may include at least one of an inorganic insulating material and/or an organic insulating material. For example, the fourth insulating layer INS4 may include various types of organic and inorganic insulating materials, including silicon nitride ($SiN_x$), silicon oxide ($SiO_x$), and aluminum oxide ($AlO_x$).

In an embodiment, the fourth insulating layer INS4 may include a thin film encapsulation layer having a multilayer structure. For example, the fourth insulating layer INS4 may be formed of a thin film encapsulation layer having a multilayer structure including at least two inorganic insulating layers and at least one organic insulating layer interposed between the at least two inorganic insulating layers but is not limited thereto. A material and/or structure of the fourth insulating layer INS4 may be variously changed.

In the display device according to an embodiment described above, the first bank BNK1, the first electrode ELT1, and the second electrode ELT2 may be formed by using a conductive polymer material including a scattering material. Accordingly, light emitted from the light emitting element LD is guided in a front direction of the display panel PNL, for example, in the third direction (Z-axis direction), thereby increasing light emission efficiency of a front surface of the display device. By simultaneously forming the first bank BNK1, the first electrode ELT1, and the second electrode ELT2, the number of masks may be reduced, resulting in a reduction in cost and simplification of a manufacturing process.

Hereinafter, another embodiment will be described. In the following embodiment, the same elements as those described above are denoted by the same reference numerals, and repetitive descriptions thereof will be omitted or simplified.

Figure 9:
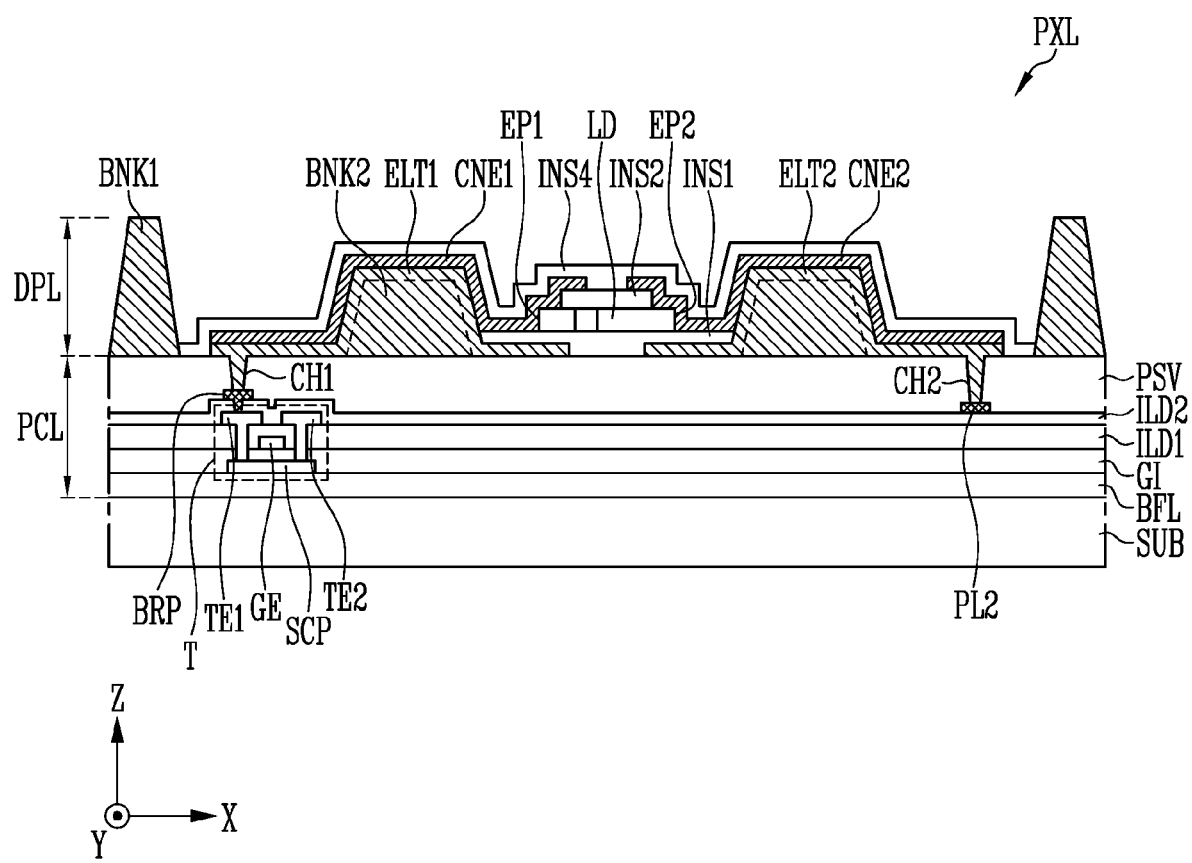
FIG. 9 is a schematic cross-sectional view of a pixel according to another embodiment.

FIG. 9 is a schematic cross-sectional view of a pixel according to another embodiment.

Referring to FIG. 9, a display device according to this embodiment is different from that of the embodiments of FIGS. 1 to 8 at least in that the second bank BNK2, the first bank BNK1, the first electrode ELT1, and/or the second electrode ELT2 includes the same material.

Specifically, the second bank BNK2 may include a conductive polymer and a scattering body dispersed in the conductive polymer. The conductive polymer may include at least one of polyfluorene, polyphenylene, polypyrene, polyazulene, polynaphthalene, polyacetylene (PAC), poly (p-phenylene vinylene) (PPV), polypyrrole (PPY), polycarbazole, polyindole, polythienylenevinylene, polyaniline (PANI), polythiophene, poly(p-phenylene sulfide) (PPS), poly(3,4-ethylenedioxy thiophene) (PEDOT), poly(3,4-ethylenedioxythiophene) polystyrene sulfonate (PEDOT:PSS) doped with polystyrene sulfonate (PSS), poly(3,4-ethylenedioxythiophene)-tetramethacrylate (PEDOT-TMA), and polyfuran, but is not limited thereto. The scattering material may include at least one of barium sulfate ($BaSO_4$), calcium carbonate ($CaCO_3$), titanium oxide ($TiO_x$), aluminum oxide ($AlO_x$), zirconium oxide ($ZrO_x$), and zinc oxide ($ZnO_x$). In this way, in case that the second bank BNK2 is formed of the conductive polymer including the scattering material, light emitted from the light emitting element LD may be guided in a front direction of the display panel PNL, for example, in the third direction (Z-axis direction), and thus, light emission efficiency of a front surface of the display device may be increased. The second bank BNK2 may be simultaneously formed by the same process as the first bank BNK1, the first electrode ELT1, and the second electrode ELT2, and thus, the number of masks may be reduced, resulting in a reduction in cost and simplification of a manufacturing process as described above.

Subsequently, a method of manufacturing the display device according to the above-described embodiments will be described.

FIGS. 10 to 14 are schematic cross-sectional views of process steps of the method of manufacturing the display device according to the embodiment. FIGS. 10 to 14 are schematic cross-sectional views illustrating the method of manufacturing the display device of FIG. 7, and elements that are substantially the same as those of FIG. 7 are denoted by the same reference numerals and detailed descriptions thereof will be omitted.

Figure 10:
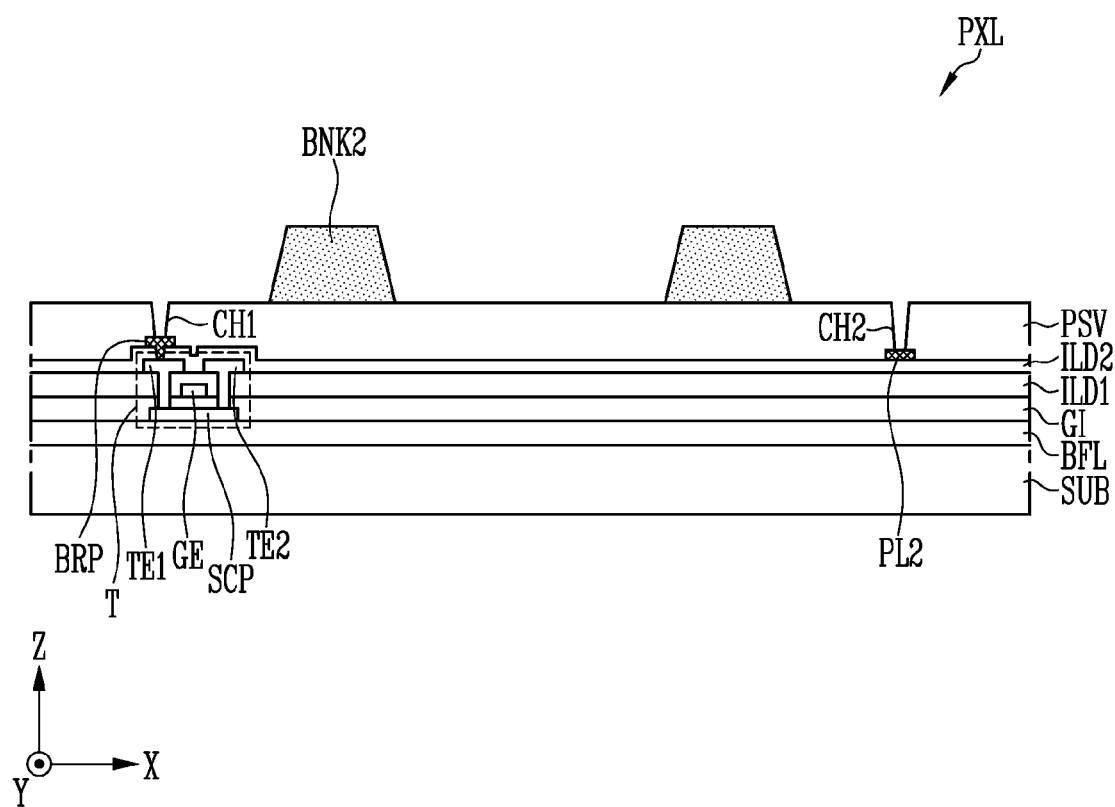
FIGS. 10 to 14 are schematic cross-sectional views of process steps of a method of manufacturing a display device, according to an embodiment.

Referring to FIG. 10, a substrate SUB in which the above-described transistor T is formed may be first prepared, and a second bank BNK2 may be formed on the substrate SUB in which pixels PXL are respectively defined.

Figure 11:
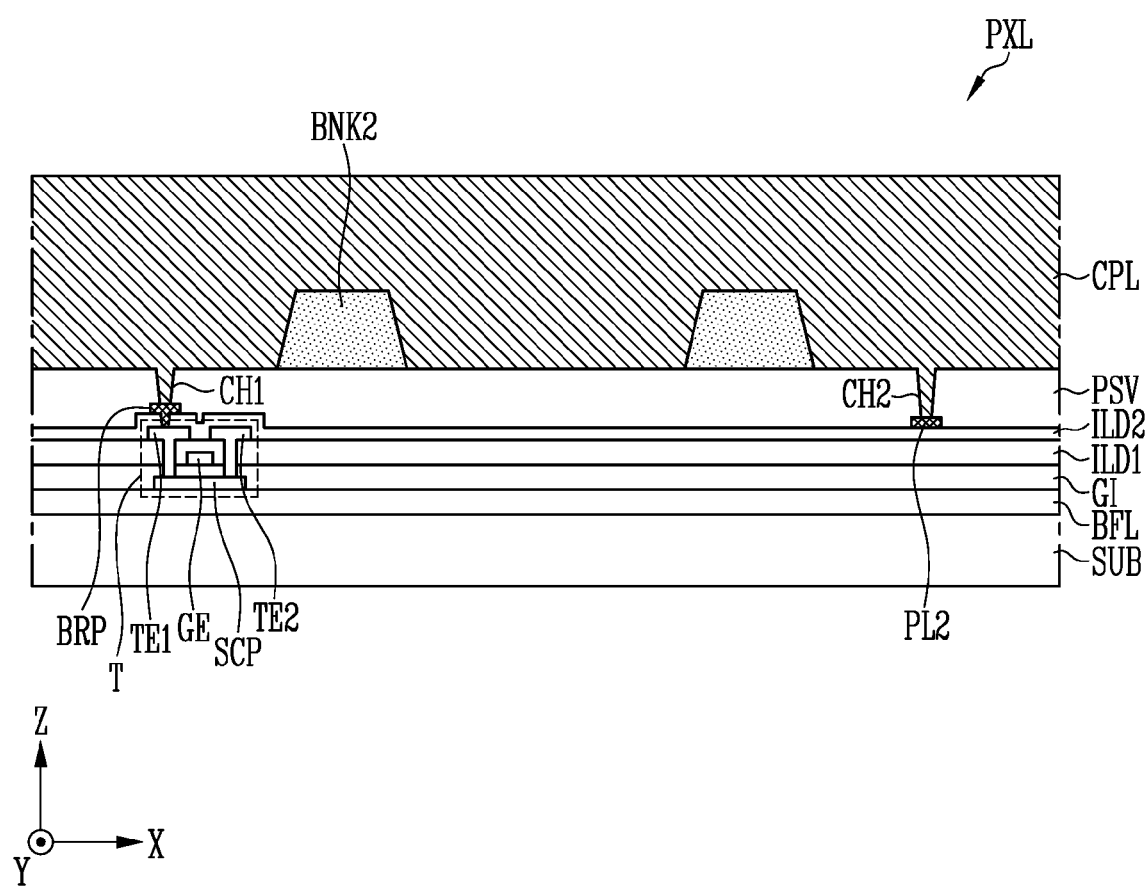

Referring to FIG. 11, a conductive polymer layer CPL may be formed on the substrate SUB on which the second bank BNK2 is formed. The conductive polymer layer CPL may include at least one of polyfluorene, polyphenylene, polypyrene, polyazulene, polynaphthalene, polyacetylene (PAC), poly(p-phenylene vinylene) (PPV), polypyrrole (PPY), polycarbazole, polyindole, polythienylenevinylene, polyaniline (PANI), polythiophene, poly(p-phenylene sulfide) (PPS), poly(3,4-ethylenedioxy thiophene) (PEDOT), poly(3,4-ethylenedioxythiophene) polystyrene sulfonate (PEDOT:PSS) doped with polystyrene sulfonate (PSS), poly (3,4-ethylenedioxythiophene)-tetramethacrylate (PEDOT-TMA), and polyfuran, but is not limited thereto. The conductive polymer layer CPL may further include a scattering material. The scattering material may include at least one of barium sulfate ($BaSO_4$), calcium carbonate ($CaCO_3$), titanium oxide ($TiO_x$), aluminum oxide ($AlO_x$), zirconium oxide ($ZrO_x$), and zinc oxide ($ZnO_x$).

Figure 12:
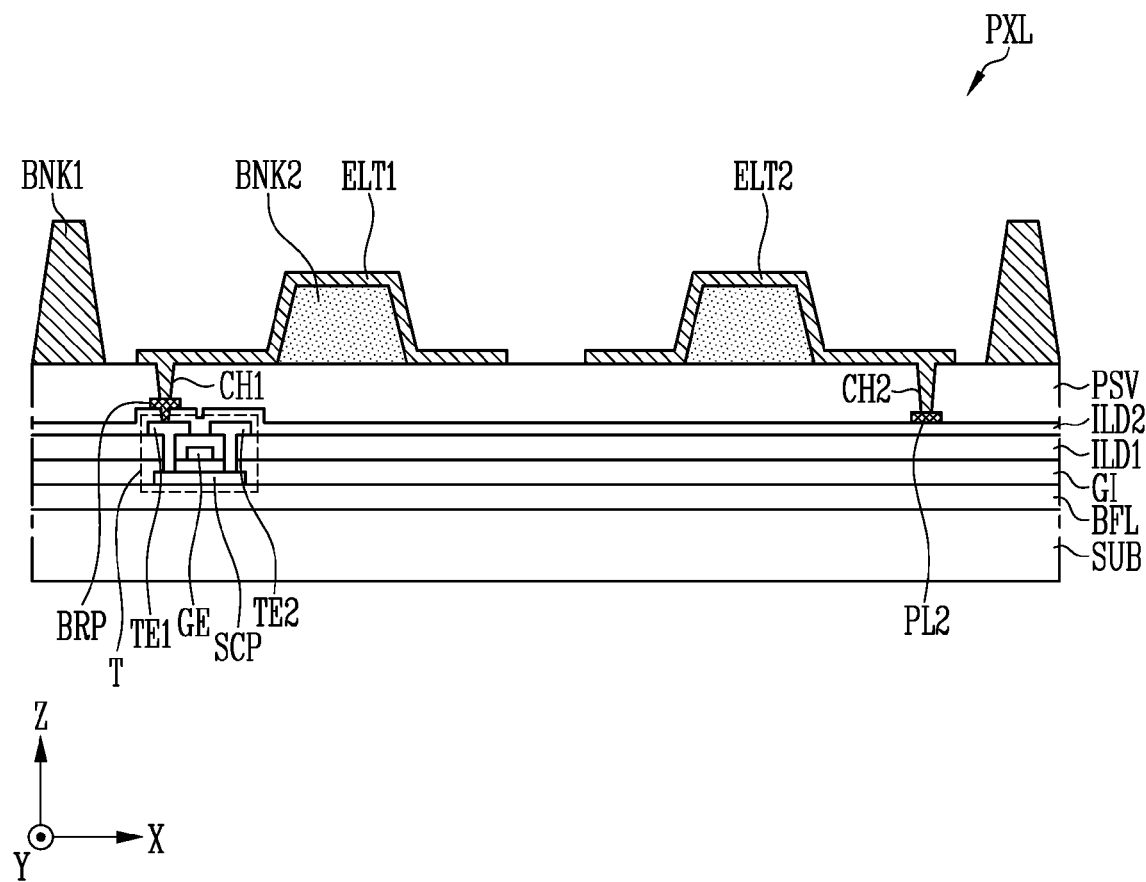

Referring to FIG. 12, subsequently, the conductive polymer layer CPL may be patterned to form a first bank BNK1, a first electrode ELT1, and a second electrode ELT2. In an embodiment, the first bank BNK1, the first electrode ELT1, and the second electrode ELT2 may be simultaneously formed by using a halftone mask. As described above, the first bank BNK1, the first electrode ELT1, and the second electrode ELT2 are simultaneously formed by the same process, and thus, the number of masks may be reduced, resulting in a reduction in cost and simplification of a manufacturing process.

Figure 13:
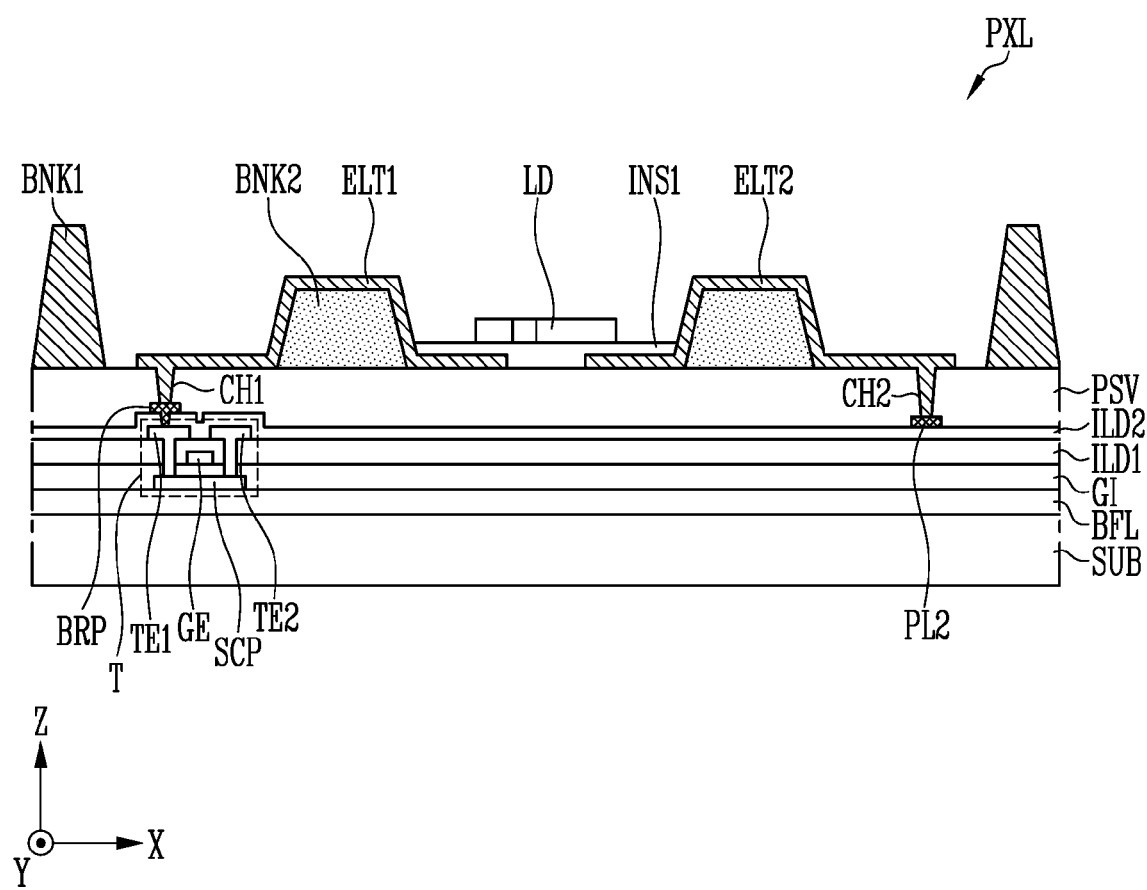

Referring to FIG. 13, subsequently, the first insulating layer INS1 may be formed on the first and second electrodes ELT1 and ELT2, and the light emitting elements LD may be provided between the first and second electrodes ELT1 and ELT2 on the first insulating layer INS1. The light emitting elements LD may be dispersed in a predetermined solution (or solvent) and be supplied to light emission regions of the pixels PXL by an inkjet printing method or the like. For example, the light emitting elements LD may be mixed with a volatile solvent and dropped into each light emission region. In this case, when a predetermined voltage is supplied through the first and second electrodes ELT1 and ELT2 of each of the pixels PXL, an electric field may be formed between the first and second electrodes ELT1 and ELT2, and the light emitting elements LD may be aligned between the first and second electrodes ELT1 and ELT2. After the light emitting elements LD are aligned, the solvent may be removed by volatilization or other methods to stably arrange the light emitting elements LD between the first and second electrodes ELT1 and ELT2.

Figure 14:
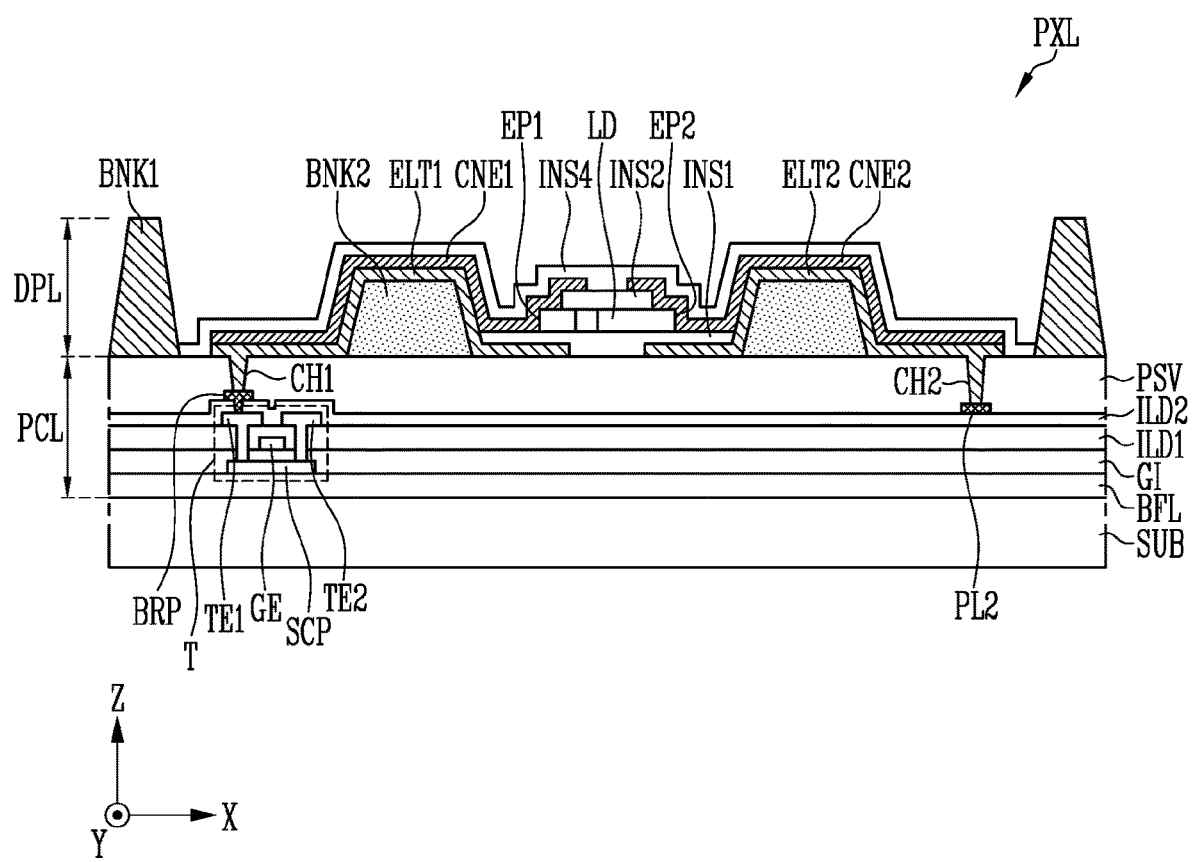

Referring to FIG. 14, subsequently, the second insulating layer INS2, the first and second contact electrodes CNE1 and CNE2, and the fourth insulating layer INS4 may be formed on the light emitting elements LD, thereby completing the display device illustrated in FIG. 7.

Hereinafter, another embodiment will be described. In the following embodiments, the same elements as those described above are denoted by the same reference numerals, and repetitive descriptions thereof will be omitted or simplified.

Figure 15:
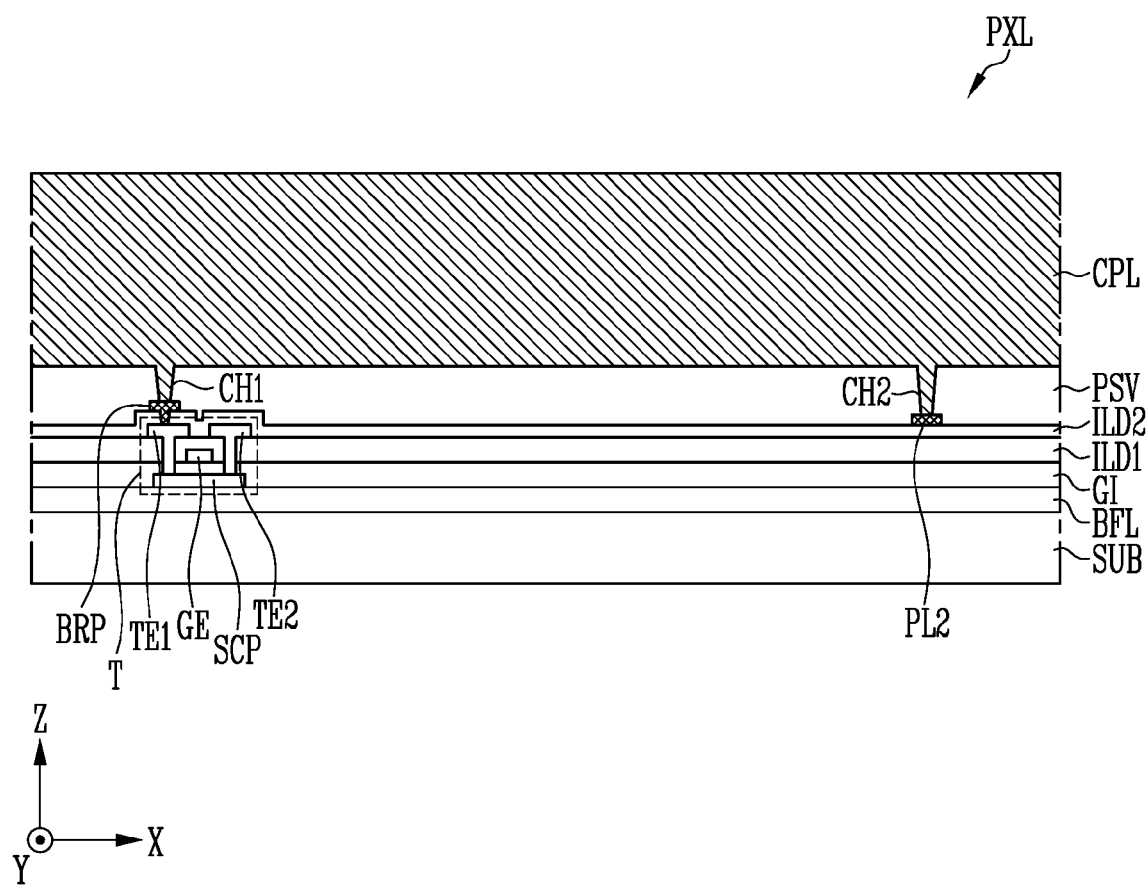
FIGS. 15 to 17 are schematic cross-sectional views of process steps of a method of manufacturing a display device, according to another embodiment.
Figure 16:
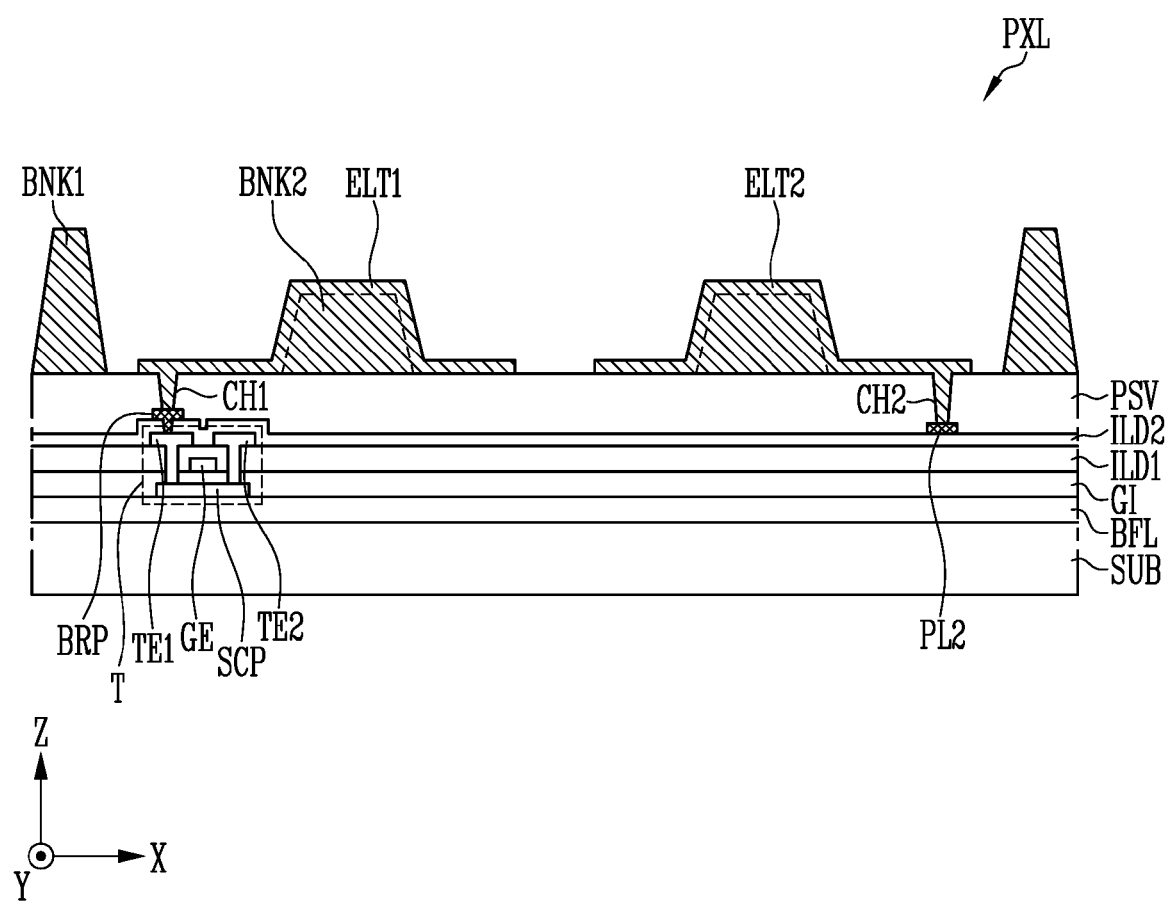
Figure 17:
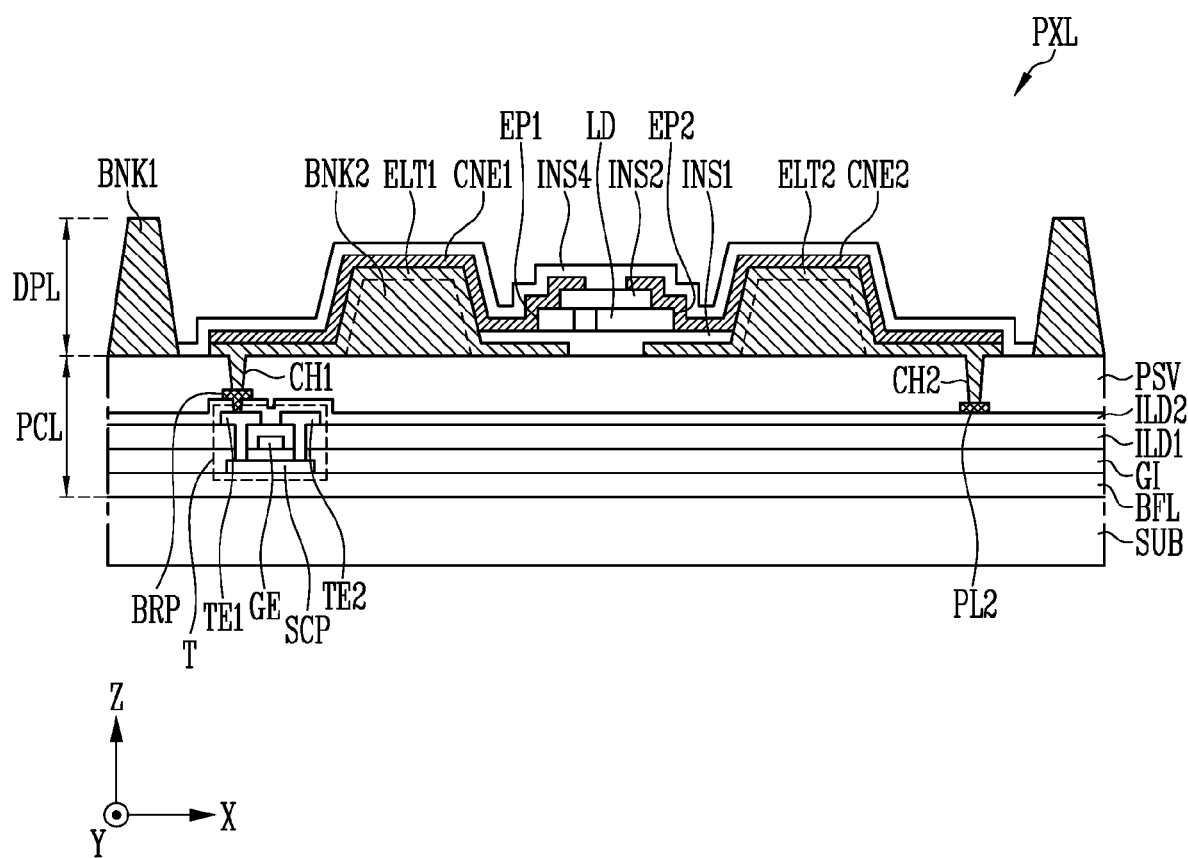

FIGS. 15 to 17 are schematic cross-sectional views of process steps of a method of manufacturing a display device according to another embodiment. FIGS. 15 to 17 are schematic cross-sectional views illustrating the method of manufacturing the display device of FIG. 9, and elements that are substantially the same as those illustrated in FIG. 9 are denoted by the same reference numerals, and detailed descriptions thereof will be omitted.

Referring to FIG. 15, a conductive polymer layer CPL may be first formed on a substrate SUB on which a transistor T or the like is formed. The conductive polymer layer CPL may include at least one of polyfluorene, polyphenylene, polypyrene, polyazulene, polynaphthalene, polyacetylene (PAC), poly(p-phenylene vinylene) (PPV), polypyrrole (PPY), polycarbazole, polyindole, polythienylenevinylene, polyaniline (PANI), polythiophene, poly(p-phenylene sulfide) (PPS), poly(3,4-ethylenedioxy thiophene) (PEDOT), poly(3,4-ethylenedioxythiophene) polystyrene sulfonate (PEDOT:PSS) doped with polystyrene sulfonate (PSS), poly (3,4-ethylenedioxythiophene)-tetramethacrylate (PEDOT-TMA), and polyfuran, but is not limited thereto. The conductive polymer layer CPL may further include a scattering material. The scattering material may include at least one of barium sulfate ($BaSO_4$), calcium carbonate ($CaCO_3$), titanium oxide ($TiO_x$), aluminum oxide ($AlO_x$), zirconium oxide ($ZrO_x$), and zinc oxide ($ZnO_x$).

Referring to FIG. 16, subsequently, the conductive polymer layer CPL may be patterned to form a first bank BNK1, a second bank BNK2, a first electrode ELT1, and a second electrode ELT2. In an embodiment, the first bank BNK1, the second bank BNK2, the first electrode ELT1, and the second electrode ELT2 may be simultaneously formed by using a halftone mask. As described above, the first bank BNK1, the second bank BNK2, the first electrode ELT1, and the second electrode ELT2 may be simultaneously formed by the same process, and thus, the number of masks may be reduced, resulting in a reduction in cost and simplification of a manufacturing process.

Referring to FIG. 17, subsequently, the light emitting elements LD may be provided between the first and second electrodes ELT1 and ELT2 on the first insulating layer INS1, and the second insulation layer INS2, the first and second contact electrodes CNE1 and CNE2, and the fourth insulating layer INS4 may be formed on the light emitting elements LD, and thus, the display device illustrated in FIG. 9 may be completed.

Those skilled in the technical field related to the embodiment will appreciate that the embodiment may be implemented in a modified form without departing from the essential features of the above description. Therefore, the disclosed methods should be considered from an explanatory point of view rather than a limiting point of view. The scope of the claimed invention is shown in the claims rather than the foregoing description, and all differences within the scope equivalent thereto should be construed as being included in the disclosure.

What is claimed is:

1. A display device comprising:
   a plurality of pixels;
   a first bank defining light emission regions of the plurality of pixels;
   a first electrode and a second electrode which are spaced apart from each other in each of the light emission regions; and
   a plurality of light emitting elements disposed between the first electrode and the second electrode,
   wherein the first bank, the first electrode, and the second electrode include a same material, and
   each of the first electrode and the second electrode are spaced apart from the first bank.

2. The display device of claim 1, wherein the first bank, the first electrode, and the second electrode include a conductive polymer.

3. The display device of claim 2, wherein the conductive polymer includes at least one of polyfluorene, polyphenylene, polypyrene, polyazulene, polynaphthalene, polyacetylene (PAC), poly(p-phenylene vinylene) (PPV), polypyrrole (PPY), polycarbazole, polyindole, polythienylenevinylene, polyaniline (PANI), polythiophene, poly(p-phenylene sulfide) (PPS), poly(3,4-ethylenedioxythiophene) (PEDOT), poly(3,4-ethylenedioxythiophene) polystyrene sulfonate (PEDOT:PSS), doped with polystyrene sulfonate (PSS), poly(3,4-ethylenedioxythiophene)-tetramethacrylate (PEDOT-TMA), and polyfuran.

4. The display device of claim 2, wherein the first bank, the first electrode, and the second electrode include a scattering material dispersed in the conductive polymer.

5. The display device of claim 4, wherein the scattering material includes at least one of barium sulfate ($BaSO_4$), calcium carbonate ($CaCO_3$), titanium oxide ($TiO_x$), aluminum oxide ($AlO_x$), zirconium oxide ($ZrO_x$), and zinc oxide ($ZnO_x$).

6. The display device of claim 1, further comprising:
   a second bank disposed between the first electrode, the second electrode, and a substrate.

7. The display device of claim 6, wherein the second bank, the first bank, the first electrode, and the second electrode include a same material.

8. The display device of claim 6, wherein the second bank includes a conductive polymer.

9. The display device of claim 1, further comprising:
   an insulating layer disposed between the first electrode, the second electrode, and the plurality of light emitting elements.

10. The display device of claim 9, wherein the insulating layer includes a resin and a scattering material dispersed in the resin.

11. The display device of claim 10, wherein the scattering material includes at least one of barium sulfate ($BaSO_4$), calcium carbonate ($CaCO_3$), titanium oxide ($TiO_x$), aluminum oxide ($AlO_x$), zirconium oxide ($ZrO_x$), and zinc oxide ($ZnO_x$).

12. The display device of claim 1, further comprising:
   a first contact electrode that electrically connects an end of each of the plurality of light emitting elements to the first electrode; and
   a second contact electrode that electrically connects another end of each of the plurality of light emitting elements to the second electrode.

13. The display device of claim 1, wherein the plurality of light emitting elements for each light emission region are electrically connected in parallel with each other via the first electrode and the second electrode.

14. The display device of claim 1, wherein each of the plurality of light emitting elements includes a first semiconductor layer, a second semiconductor layer spaced apart from the first semiconductor layer, and an active layer disposed between, and directly connected to, both of the first semiconductor layer and the second semiconductor layer.

15. The display device of claim 2, wherein all portions of the first bank comprise a conductive polymer.

16. The display device of claim 1, wherein the first bank is a single integrated monolithic unit.

17. A method of manufacturing a display device, comprising:
   providing a first electrode and a second electrode on a substrate;
   providing a first bank defining light emission regions of a plurality of pixels; and
   providing a plurality of light emitting elements between the first electrode and the second electrode, wherein the first bank, the first electrode, and the second electrode are simultaneously formed, and
   each of the first electrode and the second electrode are spaced apart from the first bank.

18. The method of manufacturing the display device of claim 17, wherein the providing of the first bank, the first electrode, and the second electrode includes:
   providing a conductive polymer layer on the substrate; and
   patterning the conductive polymer layer to simultaneously form the first bank, the first electrode, and the second electrode.

19. The method of manufacturing the display device of claim 18, wherein the conductive polymer layer includes at least one of polyfluorene, polyphenylene, polypyrene, polyazulene, polynaphthalene, polyacetylene (PAC), poly (p-phenylene vinylene) (PPV), polypyrrole (PPY), polycarbazole, polyindole, polythienylenevinylene, polyaniline (PANI), polythiophene, poly(p-phenylene sulfide) (PPS), poly(3,4-ethylenedioxythiophene) (PEDOT), poly(3,4-ethylenedioxythiophene) polystyrene sulfonate (PEDOT:PSS), doped with polystyrene sulfonate (PSS), poly(3,4-ethylenedioxythiophene)-tetramethacrylate (PEDOT-TMA), and polyfuran.

20. The method of manufacturing the display device of claim 18, wherein the conductive polymer layer includes a scattering material.

21. The method of manufacturing the display device of claim 20, wherein the scattering material includes at least one of barium sulfate ($BaSO_4$), calcium carbonate ($CaCO_3$), titanium oxide ($TiO_x$), aluminum oxide ($AlO_x$), zirconium oxide ($ZrO_x$), and zinc oxide ($ZnO_x$).

22. The method of manufacturing the display device of claim 17, further comprising:

providing a second bank between the first electrode, the second electrode, and the substrate.

23. The method of manufacturing the display device of claim 22, wherein
the second bank, the first bank, the first electrode, and the second electrode are formed at a same time.

24. The method of manufacturing the display device of claim 17, further comprising:
providing a first contact electrode that electrically connects an end of each of the plurality of light emitting elements to the first electrode; and
providing a second contact electrode that electrically connects another end of each of the plurality of light emitting elements to the second electrode.

* * * * *